United States Patent
Ishimaru et al.

(10) Patent No.: US 11,901,489 B2
(45) Date of Patent: *Feb. 13, 2024

(54) ELECTRODE STRUCTURE AND SEMICONDUCTOR LIGHT-EMITTING DEVICE

(71) Applicant: ROHM CO., LTD., Kyoto (JP)

(72) Inventors: Ryosuke Ishimaru, Kyoto (JP); Yohei Ito, Kyoto (JP); Yasuo Nakanishi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/307,645

(22) Filed: Apr. 26, 2023

(65) Prior Publication Data
US 2023/0261145 A1    Aug. 17, 2023

Related U.S. Application Data

(63) Continuation of application No. 16/739,512, filed on Jan. 10, 2020, now Pat. No. 11,664,477.

(30) Foreign Application Priority Data

Feb. 26, 2019    (JP) ................................ 2019-033071

(51) Int. Cl.
    *H01L 33/40*      (2010.01)
    *H01L 33/38*      (2010.01)

(52) U.S. Cl.
    CPC ............ *H01L 33/405* (2013.01); *H01L 33/38* (2013.01)

(58) Field of Classification Search
CPC ..... H01L 33/405; H01L 33/38; H01L 33/007; H01L 33/20; H01L 33/32; H01L 33/40–42

See application file for complete search history.

(56) References Cited

U.S. PATENT DOCUMENTS

| | | | |
|---|---|---|---|
| 11,664,477 B2 * | 5/2023 | Ishimaru | H01L 33/42 257/98 |
| 2011/0018022 A1 * | 1/2011 | Okabe | H01L 33/405 438/31 |
| 2012/0049232 A1 | 3/2012 | Okabe et al. | |
| 2013/0330852 A1 | 12/2013 | Okuyama | |
| 2014/0197374 A1 | 7/2014 | Hwang et al. | |
| 2016/0343914 A1 | 11/2016 | Jeon | |

(Continued)

FOREIGN PATENT DOCUMENTS

| | | |
|---|---|---|
| JP | H01307280 A | 12/1989 |
| JP | H05179461 A | 7/1993 |

(Continued)

OTHER PUBLICATIONS

Japanese Office Action dated Jan. 12, 2023, in the counterpart Japanese application No. 2019-033071.

(Continued)

*Primary Examiner* — Wasiul Haider
(74) *Attorney, Agent, or Firm* — Rabin & Berdo, P.C.

(57) ABSTRACT

An electrode structure includes: an indium tin oxide (ITO) electrode that includes ITO; an Al electrode that includes Al and covers the ITO electrode; and a barrier electrode that includes at least one of TiN and Cr and is interposed in a region between the ITO electrode and the Al electrode.

11 Claims, 28 Drawing Sheets

(56) References Cited

U.S. PATENT DOCUMENTS

2019/0273185 A1 9/2019 Yoon et al.
2019/0386180 A1 12/2019 Hwang et al.

FOREIGN PATENT DOCUMENTS

| JP | H11352515 A | 12/1999 |
| JP | 2005333118 A | 12/2005 |
| JP | 2006261609 A | 9/2006 |
| JP | 2008112957 A | 5/2008 |
| JP | 2009094089 A | 4/2009 |
| JP | 2011061032 A | 3/2011 |
| JP | 2014044971 A | 3/2014 |
| JP | 2014150245 A | 8/2014 |
| JP | 2018137469 A | 8/2018 |

OTHER PUBLICATIONS

Japanese Office Action dated Oct. 6, 2022 by the Japanese Patent Office.

* cited by examiner

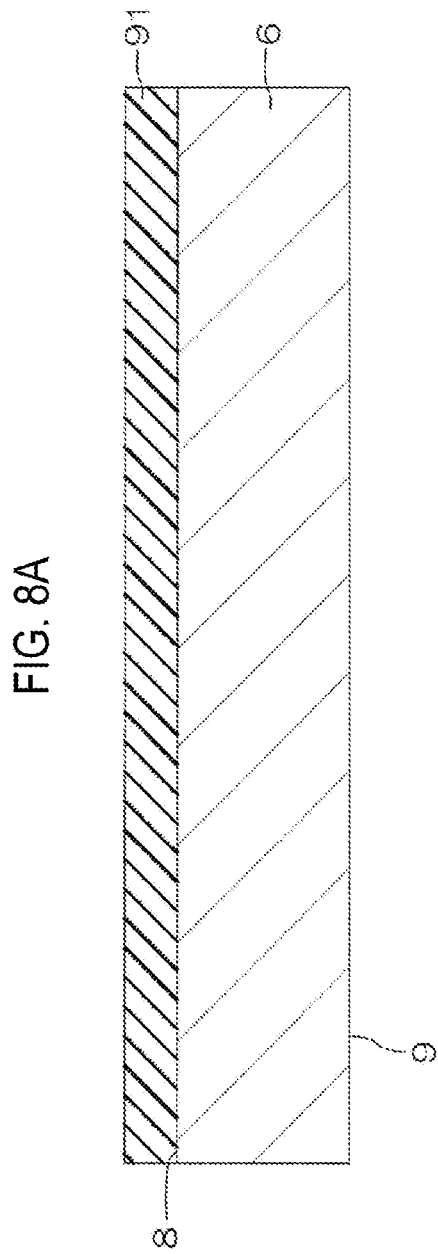

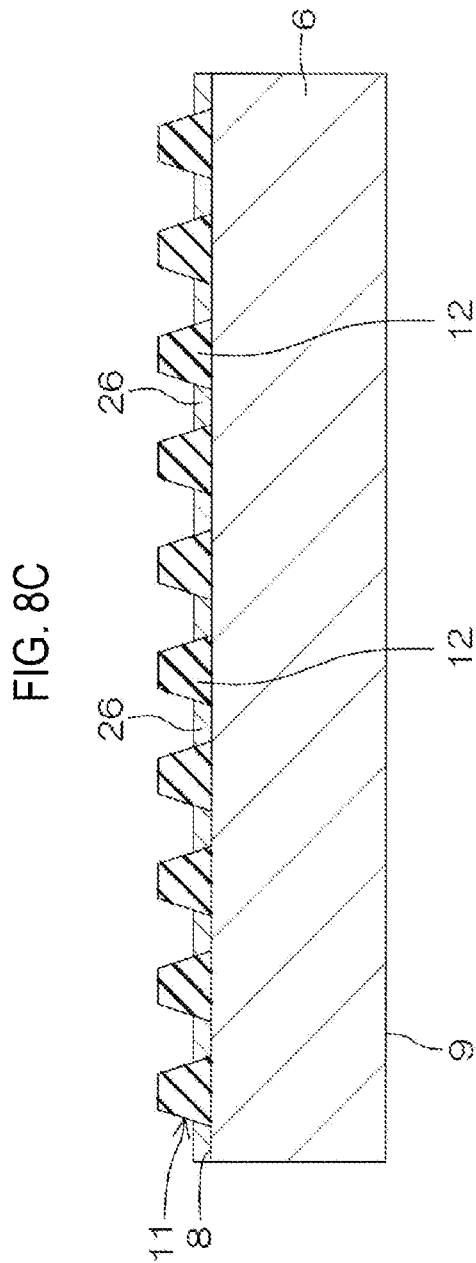

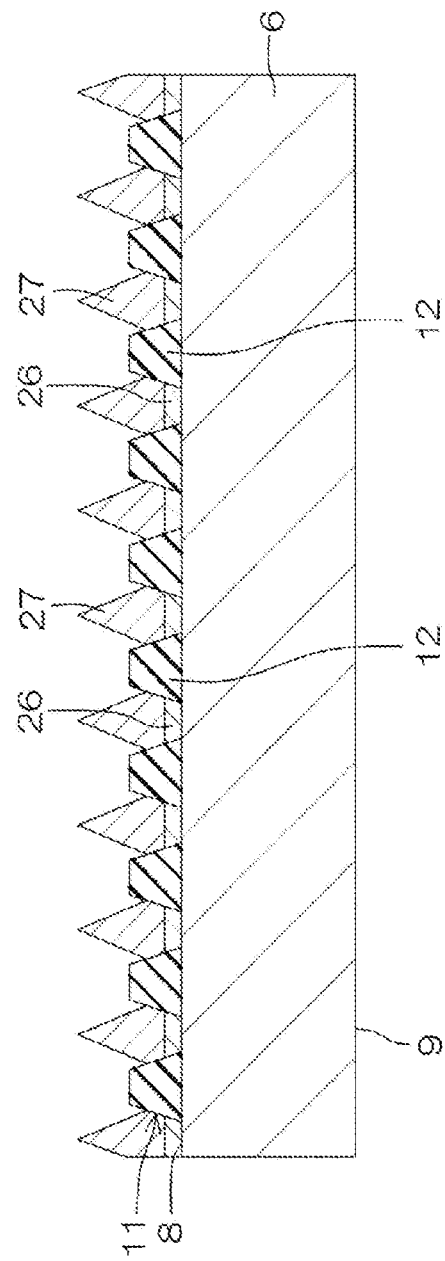

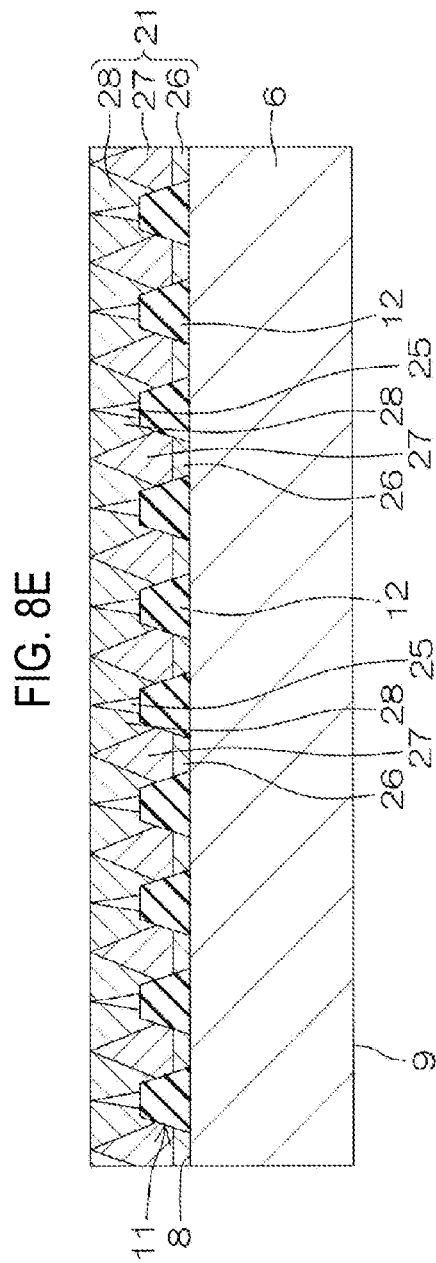

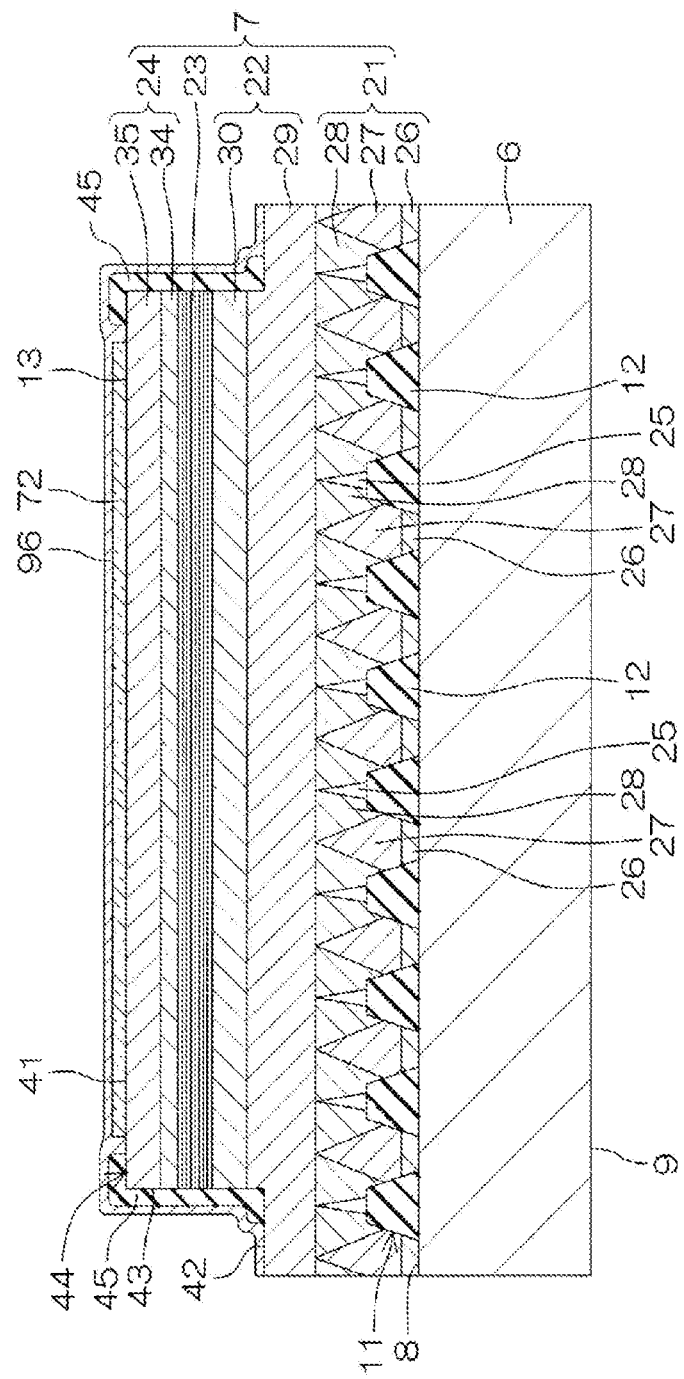

ELECTRODE STRUCTURE AND SEMICONDUCTOR LIGHT-EMITTING DEVICE

CROSS-REFERENCE TO RELATED APPLICATION

This application is a continuation of U.S. application Ser. No. 16/739,512 filed on Jan. 10, 2020, which was based upon and claimed the benefit of priority from Japanese Patent Application No. 2019-033071, filed on Feb. 26, 2019, the entire contents of which are incorporated herein by reference.

TECHNICAL FIELD

The present disclosure relates to an electrode structure and a semiconductor light-emitting device.

BACKGROUND

There is known an electrode structure including an indium tin oxide (ITO) electrode and an aluminum (Al) electrode, which is in contact with the ITO electrode.

In the structure in which the Al electrode is in contact with the ITO electrode, galvanic corrosion occurs in the ITO electrode due to a difference in ionization tendency between the Al electrode and the ITO electrode.

SUMMARY

Some embodiments of the present disclosure provide an electrode structure and a semiconductor light-emitting device capable of suppressing galvanic corrosion of an ITO electrode.

According to one embodiment of the present disclosure, there is provided an electrode structure including: an indium tin oxide (ITO) electrode including ITO; an Al electrode including Al and covering the ITO electrode; and a barrier electrode including at least one of TiN and Cr and interposed in a region between the ITO electrode and the Al electrode.

According to another embodiment of the present disclosure, there is provided a semiconductor light-emitting device including: a semiconductor light-emitting layer having a main surface and generating red light; an indium tin oxide (ITO) electrode including ITO and covering the main surface of the semiconductor light-emitting layer; an Al electrode including Al and covering the ITO electrode; and a barrier electrode including at least one of TiN and Cr and interposed in a region between the ITO electrode and the Al electrode.

BRIEF DESCRIPTION OF DRAWINGS

FIG. 8A is a cross-sectional view of a region corresponding to FIG. 3, and is a cross-sectional view illustrating an example of a method of manufacturing the semiconductor light-emitting device shown in FIG. 1.

FIG. 8C is a cross-sectional view illustrating a next step of FIG. 8B.

FIG. 8D is a cross-sectional view illustrating a next step of FIG. 8C.

FIG. 8E is a cross-sectional view illustrating a next step of FIG. 8D.

FIG. 8K is a cross-sectional view illustrating a next step of FIG. 8J.

DETAILED DESCRIPTION

Embodiments of the present disclosure will now be described in detail with reference to the drawings.

Figure 1:
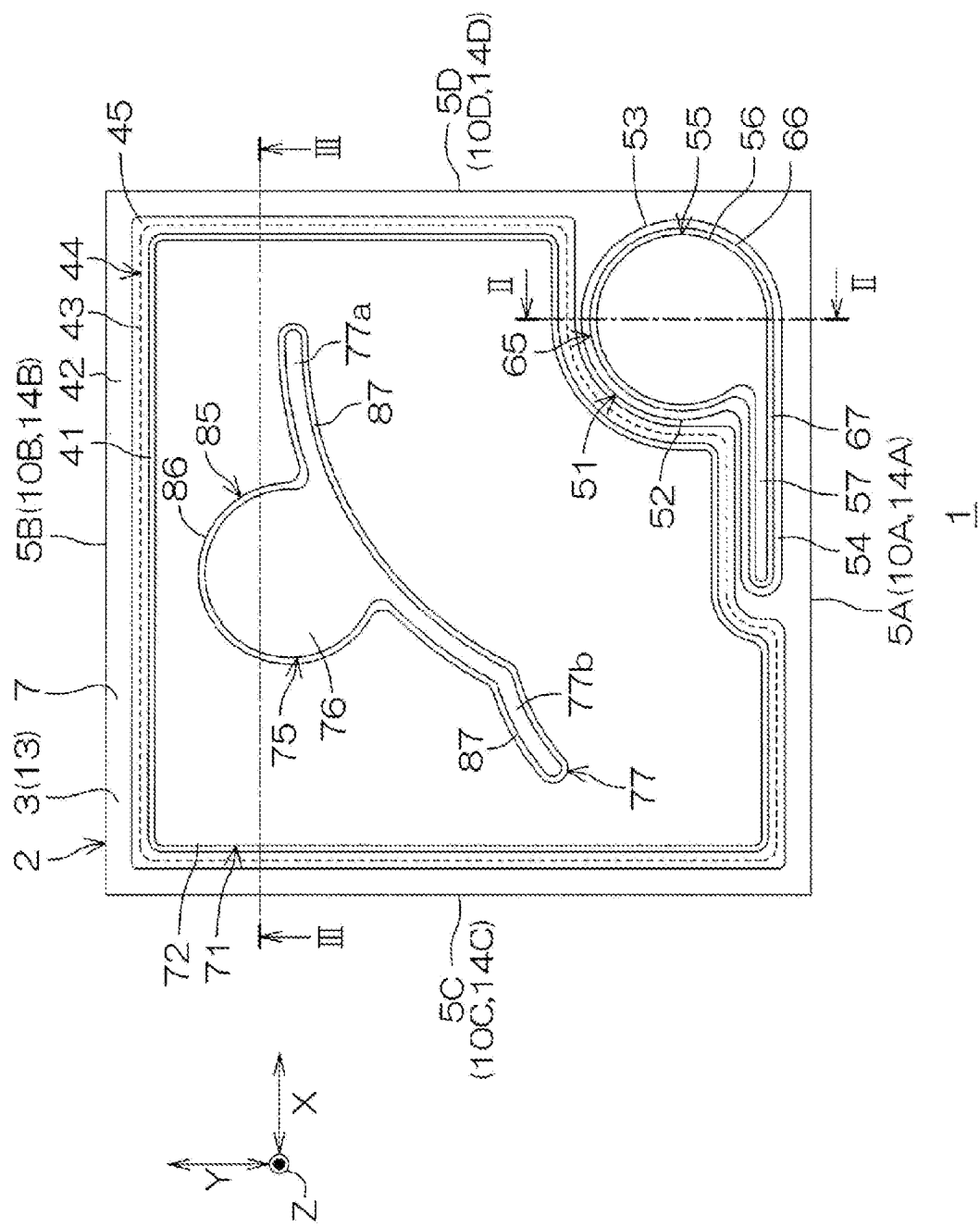
FIG. 1 is a plan view illustrating a semiconductor light-emitting device according to a first embodiment of the present disclosure.
Figure 2:
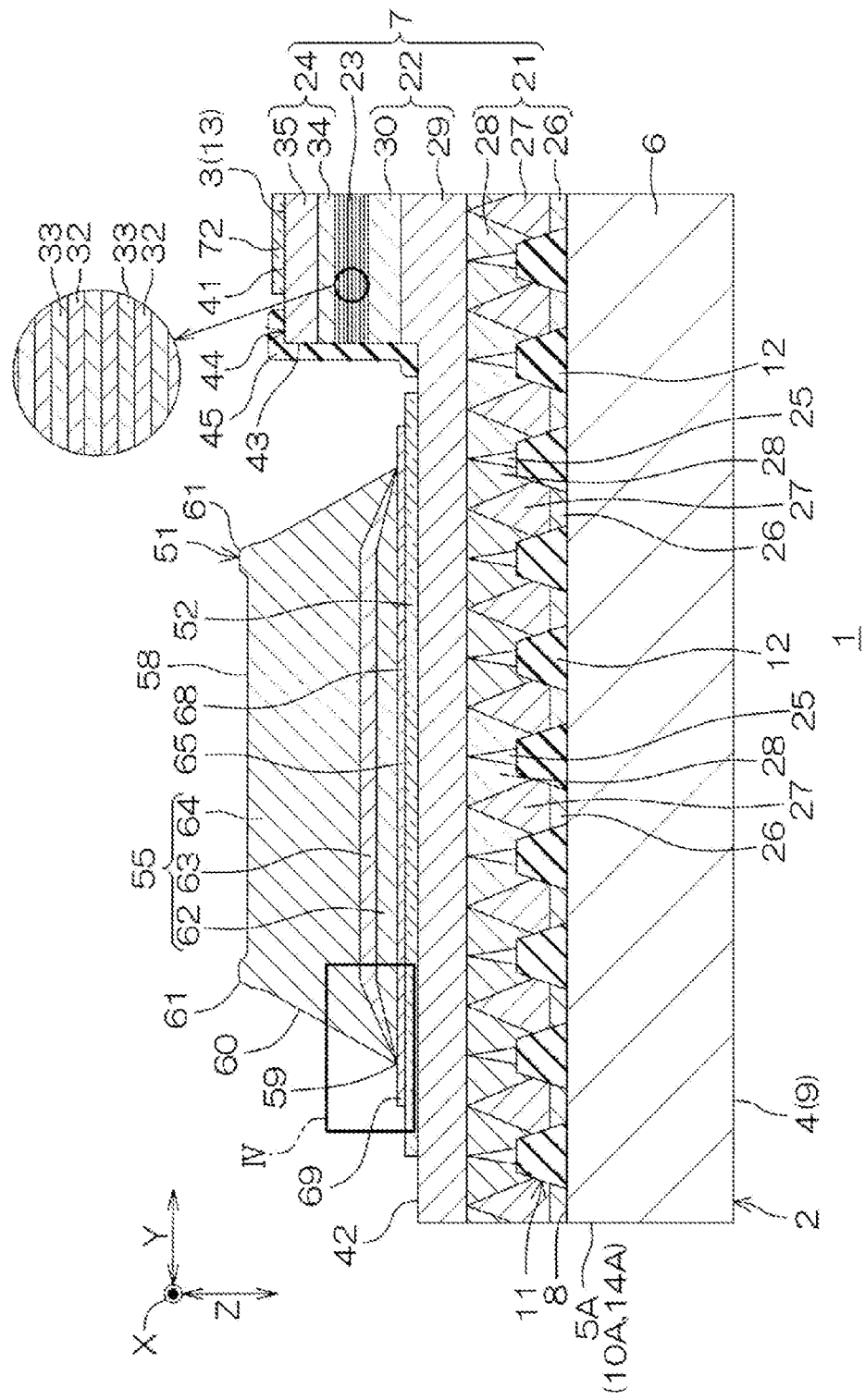
FIG. 2 is a cross-sectional view taken along line II-II in FIG. 1.
Figure 3:
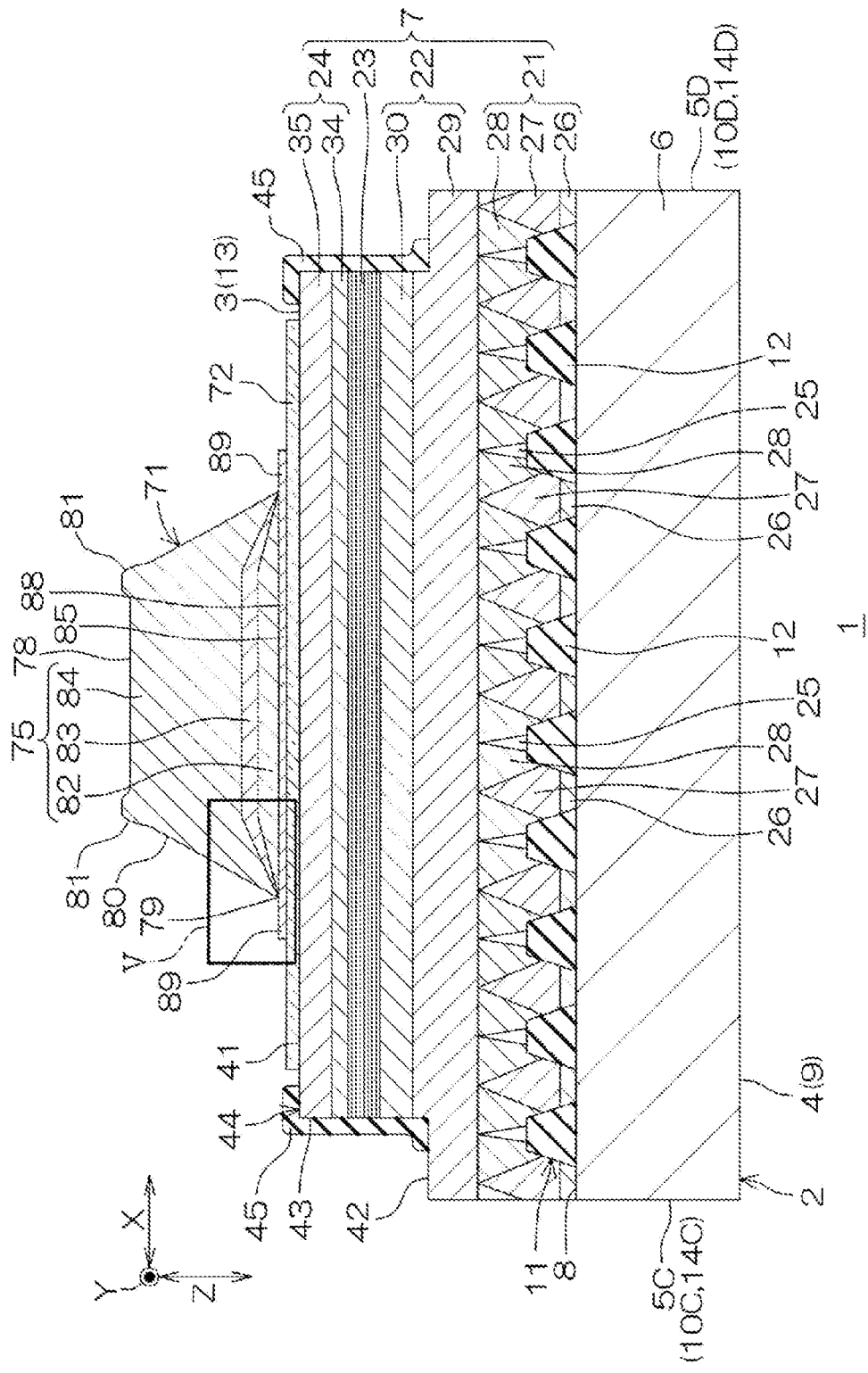
FIG. 3 is a cross-sectional view taken along line in FIG. 1.
Figure 4:
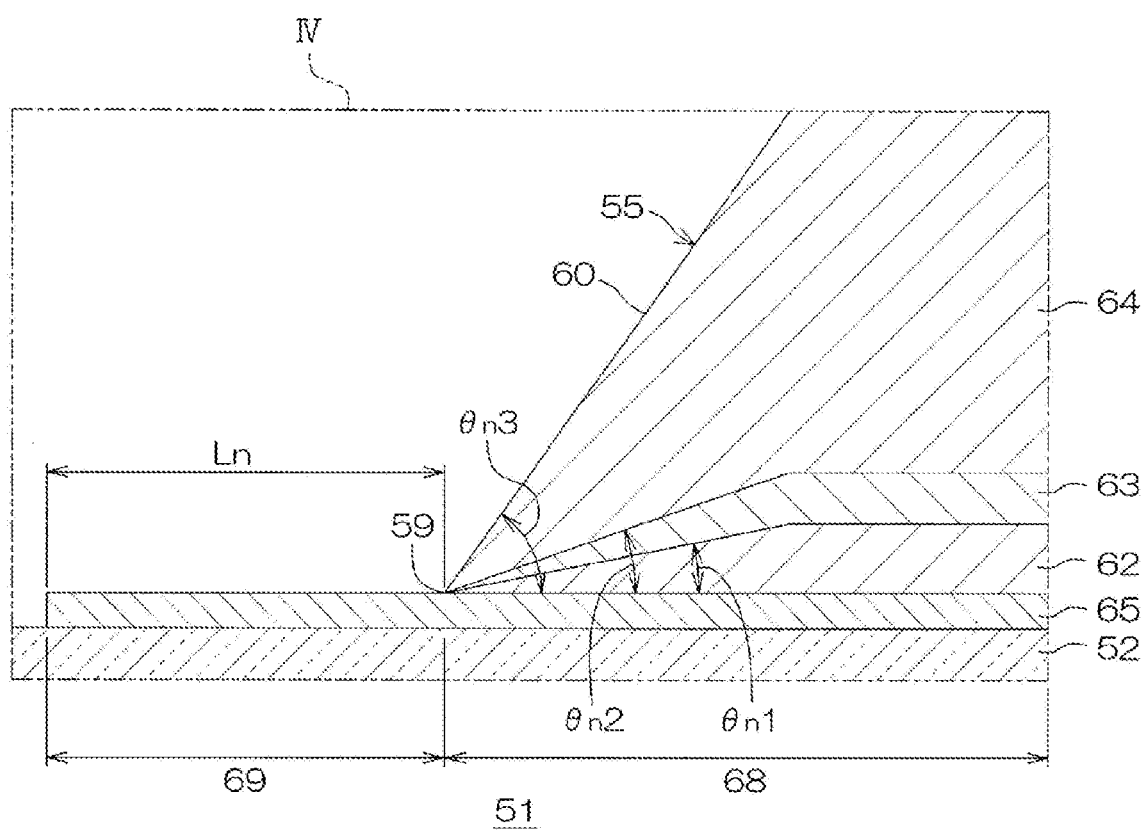
FIG. 4 is an enlarged view of a region IV shown in FIG. 2.
Figure 5:
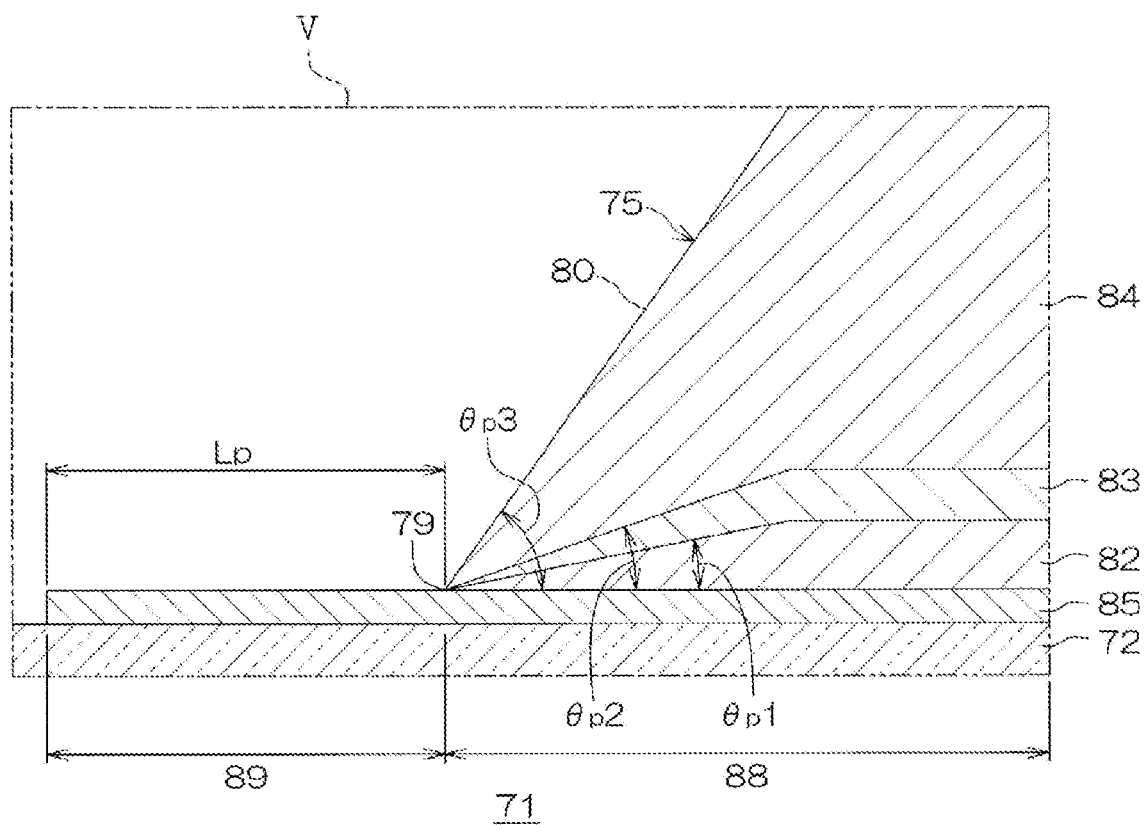
FIG. 5 is an enlarged view of a region V shown in FIG. 3.
Figure 6:
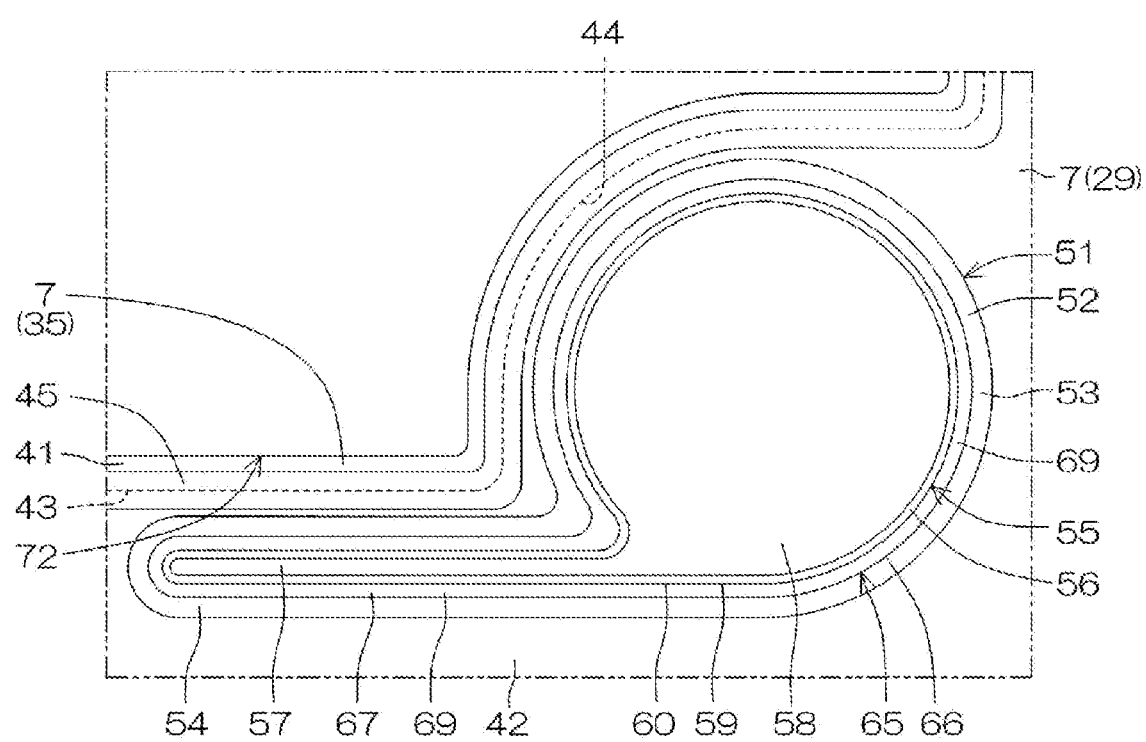
FIG. 6 is an enlarged plan view of a wiring electrode of an n-side electrode shown in FIG. 1.
Figure 7:
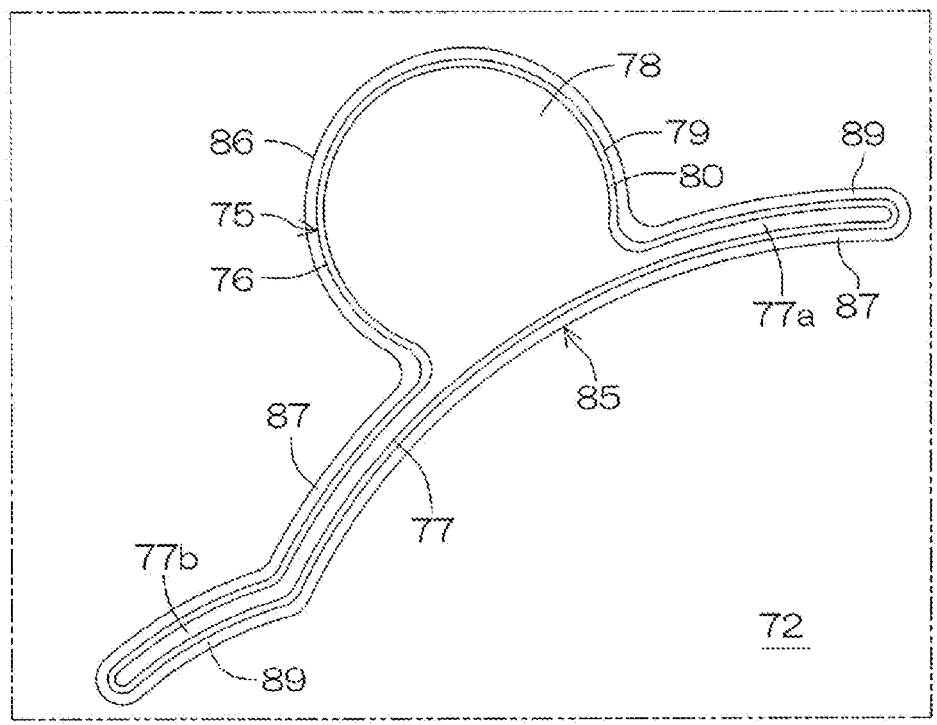
FIG. 7 is an enlarged plan view of a wiring electrode of a p-side electrode shown in FIG. 1.

FIG. 1 is a plan view illustrating a semiconductor light-emitting device 1 according to a first embodiment of the present disclosure. FIG. 2 is a cross-sectional view taken along line II-II in FIG. 1. FIG. 3 is a cross-sectional view taken along line in FIG. 1. FIG. 4 is an enlarged view of a region IV shown in FIG. 2. FIG. 5 is an enlarged view of a region V shown in FIG. 3. FIG. 6 is an enlarged plan view of a wiring electrode 55 of an n-side electrode 51 shown in FIG. 1. FIG. 7 is an enlarged plan view of a wiring electrode 75 of a p-side electrode 71 shown in FIG. 1.

Referring to FIGS. 1 to 3, the semiconductor light-emitting device 1 includes a chip body 2. The chip body 2 includes a first chip main surface 3 on one side, a second chip main surface 4 on the other side, and chip side surfaces 5A, 5B, 5C, and 5D connecting the first chip main surface 3 and the second chip main surface 4. More specifically, the chip side surfaces 5A to 5D include a first chip side surface 5A, a second chip side surface 5B, a third chip side surface 5C, and a fourth chip side surface 5D. The first chip main surface 3 and the second chip main surface 4 are formed in a square shape in a plan view as viewed in their normal direction Z (hereinafter, simply referred to as "plan view").

The first chip side surface 5A and the second chip side surface 5B extend along a first direction X in a plan view and face each other in a second direction Y intersecting the first direction X. The third chip side surface 5C and the fourth chip side surface 5D extend along the second direction Y in a plan view and face each other in the first direction X. More specifically, the second direction Y is orthogonal to the first direction X. The chip side surfaces 5A to 5D extend in plane along the normal direction Z.

More specifically, the chip body 2 has a stacked structure including a substrate 6 and a semiconductor light-emitting layer 7. The substrate 6 forms parts of the second chip main surface 4 and the chip side surfaces 5A to 5D of the chip body 2. The semiconductor light-emitting layer 7 forms parts of the first chip main surface 3 and the chip side surfaces 5A to 5D of the chip body 2.

The substrate 6 includes a first substrate main surface 8 on one side, a second substrate main surface 9 on the other side, and substrate side surfaces 10A, 10B, 10C, and 10D connecting the first substrate main surface 8 and the second substrate main surface 9. More specifically, the substrate side surfaces 10A to 10D include a first substrate side surface 10A, a second substrate side surface 10B, a third substrate side surface 10C, and a fourth substrate side surface 10D.

The first substrate main surface 8 and the second substrate main surface 9 are formed in a square shape in a plan view. The second substrate main surface 9 forms the second chip main surface 4. The substrate side surfaces 10A to 10D form parts of the chip side surfaces 5A to 5D of the chip body 2, respectively.

The substrate 6 is formed as a light-transmitting substrate. In the present embodiment, the substrate 6 is formed as an impurity-free sapphire substrate as an example of the light-transmitting substrate. The thickness of the substrate 6 may be 50 μm or more and 350 μm or less. The thickness of the substrate 6 may be 50 μm or more and 100 μm or less, 100 μm or more and 150 μm or less, 150 μm or more and 200 μm or less, 200 μm or more and 250 μm or less, 250 μm or more and 300 μm or less, or 300 μm or more and 350 μm or less.

In the present embodiment, an uneven structure 11 is formed on the first substrate main surface 8 of the substrate 6. The uneven structure 11 diffusely reflects light generated by the semiconductor light-emitting layer 7 toward the first chip main surface 3 of the chip body 2. Thus, the extraction efficiency of the light generated by the semiconductor light-emitting layer 7 is enhanced.

In the present embodiment, the uneven structure 11 includes a plurality of protrusions 12 that form unevenness on the first substrate main surface 8 of the substrate 6. The protrusions 12 are arranged on the first substrate main surface 8 at intervals from one another. The protrusions 12 may be arranged in a matrix or zig-zag form in a plan view. The protrusions 12 are formed in a frustum shape, a dome shape, or a hemispherical shape. The protrusions 12 may be formed in a truncated cone shape or an n-truncated (where n≥3) pyramid shape as an example of the frustum shape.

In the present embodiment, each of the protrusions 12 includes an insulator. Each of the protrusions 12 may include silicon oxide or silicon nitride as an example of the insulator. In the present embodiment, the protrusions 12 are formed of silicon nitride.

The semiconductor light-emitting layer 7 is stacked on the first substrate main surface 8 of the substrate 6. In the present embodiment, the semiconductor light-emitting layer 7 generates light having a peak emission wavelength in a range of 450 nm or more and 550 nm or less. That is, the semiconductor light-emitting layer 7 generates blue light, blue green light, or green light. The light generated by the semiconductor light-emitting layer 7 is extracted from the first chip main surface 3 of the chip body 2.

The semiconductor light-emitting layer 7 includes a semiconductor main surface 13 and semiconductor side surfaces 14A, 14B, 14C, and 14D. More specifically, the semiconductor side surfaces 14A to 14D include a first semiconductor side surface 14A, a second semiconductor side surface 14B, a third semiconductor side surface 14C, and a fourth semiconductor side surface 14D.

The semiconductor main surface 13 is formed in a square shape in a plan view. The semiconductor main surface 13 is a light extraction surface. The semiconductor main surface 13 forms the first chip main surface 3. The semiconductor side surfaces 14A to 14D are connected to the substrate side surfaces 10A to 10D. The semiconductor side surfaces 14A to 14D are formed flush with the substrate side surfaces 10A to 10D. The semiconductor side surfaces 14A to 14D form parts of the chip side surfaces 5A to 5D of the chip body 2, respectively.

The semiconductor light-emitting layer 7 has a stacked structure including a buffer layer 21, an n-type semiconductor layer 22, an active layer 23, and a p-type semiconductor layer 24, which are stacked sequentially from a side of the first substrate main surface 8 of the substrate 6.

The buffer layer 21 includes GaN with no impurity added and covers the protrusions 12 on the first substrate main surface 8 of the substrate 6. The thickness of the buffer layer 21 may be 0.1 μm or more and 5 μm or less. The thickness of the buffer layer 21 may be 0.1 μm or more and 0.5 μm or less, 0.5 μm or more and 1 μm or less, 1 μm or more and 1.5 μm or less, 1.5 μm or more and 2 μm or less, 2 μm or more and 3 μm or less, 3 μm or more and 4 μm or less, or 4 μm or more and 5 μm or less.

In the present embodiment, the buffer layer 21 includes a plurality of empty holes 25. The empty holes 25 are respectively formed on tops of the protrusions 12. The empty holes 25 are respectively formed with the protrusions 12 as starting points, and are formed in a one-to-one correspondence relation to the protrusions 12. The empty holes 25 are respectively formed in a line shape extending along the normal direction Z from the tops of the protrusions 12 toward the semiconductor main surface 13 in a cross-sectional view.

In the present embodiment, the buffer layer 21 includes a plurality (two or more) of buffer layers stacked on the first substrate main surface 8 of the substrate 6. The number of buffer layers stacked is arbitrary and is not limited to a specific number. In the present embodiment, the buffer layer 21 includes a first buffer layer 26, a second buffer layer 27, and a third buffer layer 28, which are stacked sequentially from a side of the first substrate main surface 8. Each of the first buffer layer 26, the second buffer layer 27, and the third buffer layer 28 includes GaN with no impurity added.

The first buffer layer 26 covers the first substrate main surface 8 of the substrate 6. The first buffer layer 26 includes GaN which is crystal-grown on the first substrate main surface 8 in a film shape. The first buffer layer 26 is formed in a region on a side of the first substrate main surface 8 of the substrate 6 with respect to the top of the protrusions 12.

The second buffer layer 27 is formed on the first buffer layer 26. The second buffer layer 27 includes GaN, which is three-dimensionally crystal-grown on the first buffer layer 26. The second buffer layer 27 is formed in a tapered shape from the first buffer layer 26 toward the semiconductor main surface 13. The second buffer layer 27 has a base and a top.

The base of the second buffer layer 27 is located on a side of the first substrate main surface 8 of the substrate 6 with respect to the tops of the protrusions 12. The top of the second buffer layer 27 protrudes toward the semiconductor main surface 13 with respect to the tops of the protrusions 12. The second buffer layer 27 is formed so as to expose at least the tops of the protrusions 12. In the present embodiment, the second buffer layer 27 exposes the tops and parts of sidewalls of the protrusions 12.

The third buffer layer 28 is formed on the second buffer layer 27. The third buffer layer 28 includes GaN, which is two-dimensionally crystal-grown on the second buffer layer 27. The third buffer layer 28 covers the second buffer layer 27 and the protrusions 12. The third buffer layer 28 partitions the empty holes 25, together with the tops of the protrusions 12.

The n-type semiconductor layer 22 is formed on the buffer layer 21. In the present embodiment, the n-type semiconductor layer 22 has a stacked structure including an n-type contact layer 29 and an n-type clad layer 30.

In the present embodiment, the n-type contact layer 29 includes GaN with an n-type impurity added. The n-type contact layer 29 may include silicon as an example of the n-type impurity. The n-type impurity concentration of the n-type contact layer 29 may be $5 \times 10^{17}$ cm$^{-3}$ or more and $5 \times 10^{19}$ cm$^{-3}$ or less. In the present embodiment, the n-type impurity concentration of the n-type contact layer 29 is about $5 \times 10^{18}$ cm$^{-3}$.

The thickness of the n-type contact layer 29 may be 0.1 μm or more and 10 μm or less. The thickness of the n-type contact layer 29 may be 0.1 μm or more and 1 μm or less, 1 μm or more and 2 μm or less, 2 μm or more and 4 μm or less, 4 μm or more and 6 μm or less, 6 μm or more and 8 μm or less, or 8μm or more and 10 μm or less.

In the present embodiment, the n-type clad layer 30 includes GaN with an n-type impurity added. The n-type clad layer 30 may include silicon as an example of the n-type impurity. The n-type impurity concentration of the n-type clad layer 30 may be equal to or less than the n-type impurity concentration of the n-type contact layer 29. The n-type impurity concentration of the n-type clad layer 30 may be less than the n-type impurity concentration of the n-type contact layer 29. The n-type impurity concentration of the n-type clad layer 30 may be $5 \times 10^{17}$ cm$^{-3}$ or more and $5 \times 10^{19}$ cm$^{-3}$ or less. In the present embodiment, the n-type impurity concentration of the n-type clad layer 30 is about $3 \times 10^{18}$ cm$^{-3}$.

The thickness of the n-type clad layer 30 may be 50 nm or more and 500 nm or less. The thickness of the n-type clad layer 30 may be 50 nm or more and 100 nm or less, 100 nm or more and 150 nm or less, 150 nm or more and 200 nm or less, 200 nm or more and 250 nm or less, 250 nm or more and 300 nm or less, 300 nm or more and 350 nm or less, 350 nm or more and 400 nm or less, 400 nm or more and 450 nm or less, or 450 nm or more and 500 nm or less. In the present embodiment, the thickness of the n-type clad layer 30 is about 200 nm.

The active layer 23 is formed on the n-type clad layer 30. In the present embodiment, the active layer 23 has a multiple quantum well structure. The multiple quantum well structure will also be referred to as a multi quantum well (MQW) layer. The multiple quantum well structure includes a plurality of barrier layers 32 and a plurality of well layers 33, which are alternately stacked.

The barrier layers 32 and the well layers 33 may be alternately stacked by 5 to 20 layers. The number and order of the barrier layers 32 and the well layers 33 stacked are arbitrary. The lowermost layer of the multiple quantum well structure may be the barrier layer 32 or the well layer 33. The uppermost layer of the multiple quantum well structure may be the barrier layer 32 or the well layer 33.

The barrier layer 32 includes AlGaN with an impurity added or AlGaN with no impurity added. In the present embodiment, the barrier layer 32 includes AlGaN with an impurity added. The barrier layer 32 may include silicon as an example of the impurity. The impurity concentration of the barrier layer 32 may be $5 \times 10^{16}$ cm$^{-3}$ or more and $5 \times 10^{20}$ cm$^{-3}$ or less.

The thickness of the barrier layer 32 may be 0.1 nm or more and 5 nm or less. The thickness of the barrier layer 32 may be 0.1 nm or more and 0.5 nm or less, 0.5 nm or more and 1 nm or less, 1 nm or more and 1.5 nm or less, or 1.5 nm or more and 2 nm or less.

The well layer 33 includes AlInGaN with no impurity added. The well layer 33 may have a thickness exceeding the thickness of the barrier layer 32. The thickness of the well layer 33 may be 5 nm or more and 50 nm or less. The thickness of the well layer 33 may be 5 nm or more and 10 nm or less, 10 nm or more and 20 nm or less, 20 nm or more and 30 nm or less, 30 nm or more and 40 nm or less, or 40 nm or more and 50 nm or less.

The p-type semiconductor layer 24 is formed on the active layer 23. In the present embodiment, the p-type semiconductor layer 24 has a stacked structure including a p-type clad layer 34 and a p-type contact layer 35.

The p-type clad layer 34 is formed on the active layer 23. In the present embodiment, the p-type clad layer 34 includes AlGaN with a p-type impurity added. The p-type clad layer 34 may include magnesium as an example of the p-type impurity. The p-type impurity concentration of the p-type clad layer 34 may be $5 \times 10^{18}$ cm$^{-3}$ or more and $5 \times 10^{20}$ cm$^{-3}$ or less. In the present embodiment, the p-type impurity concentration of the p-type clad layer 34 is about $5 \times 10^{19}$ cm$^{-3}$.

The thickness of the p-type clad layer 34 may be 10 nm or more and 50 nm or less. The thickness of the p-type clad layer 34 may be 10 nm or more and 20 nm or less, 20 nm or more and 30 nm or less, 30 nm or more and 40 nm or less, or 40 nm or more and 50 nm or less. In the present embodiment, the thickness of the p-type clad layer 34 is about 30 nm.

The p-type contact layer 35 is formed on the p-type clad layer 34. In the present embodiment, the p-type contact layer 35 includes GaN with a p-type impurity added. The p-type contact layer 35 may include magnesium as an example of the p-type impurity. The p-type impurity concentration of the p-type contact layer 35 may be $1 \times 10^{18}$ cm$^{-3}$ or more and $1 \times 10^{22}$ cm$^{-3}$ or less. In the present embodiment, the p-type impurity concentration of the p-type contact layer 35 is about $2 \times 10^{20}$ cm$^{-3}$.

The thickness of the p-type contact layer 35 may be 50 nm or more and 500 nm or less. The thickness of the p-type clad layer 34 may be 50 nm or more and 100 nm or less, 100 nm or more and 150 nm or less, 150 nm or more and 200 nm or less, 200 nm or more and 250 nm or less, 250 nm or more and 300 nm or less, 300 nm or more and 350 nm or less, 350 nm or more and 400 nm or less, 400 nm or more and 450 nm or less, or 450 nm or more and 500 nm or less. In the present embodiment, the thickness of the p-type clad layer 34 is about 200 nm.

A high region part 41, a low region part 42, and a connection part 43 are formed on the semiconductor main surface 13 of the semiconductor light-emitting layer 7. The high region part 41, the low region part 42, and the connection part 43 are formed by cutting out the semiconductor light-emitting layer 7. The high region part 41, the low region part 42, and the connection part 43 form a plateau-like mesa structure 44.

The high region part 41 is located at a relatively high position of the semiconductor light-emitting layer 7 in the thickness direction (stacking direction). The high region part 41 is formed by the p-type semiconductor layer 24. More specifically, the high region part 41 is formed by the p-type contact layer 35. In the present embodiment, the high region part 41 is formed in the central portion of the semiconductor light-emitting layer 7 with an interval from the semiconductor side surfaces 14A to 14D in a plan view.

The high region part 41 has four sides extending in parallel along the semiconductor side surfaces 14A to 14D, respectively, in a plan view. The planar shape of the high region part 41 is arbitrary and is not limited to a specific shape. The high region part 41 may be formed in a polygonal shape, a circular shape, an elliptical shape, or the like in a plan view.

The low region part 42 is located at a low position with respect to the high region part 41 in the thickness direction (stacking direction) of the semiconductor light-emitting layer 7. The low region part 42 is formed by the n-type semiconductor layer 22. More specifically, the low region part 42 is formed by the n-type contact layer 29. The low region part 42 extends in a band shape along the periphery of the high region part 41 in a plan view. In the present embodiment, the low region part 42 is formed in an endless shape (annular shape) surrounding the high region part 41 in a plan view.

The connection part 43 connects the high region part 41 and the low region part 42. The connection part 43 is formed by a part of the n-type semiconductor layer 22 (n-type contact layer 29), the active layer 23, and the p-type semiconductor layer 24. The connection part 43 has four sides extending in parallel along the semiconductor side surfaces 14A to 14D, respectively, in a plan view. The connection part 43 extends in plane along the normal direction Z. The connection part 43 may be inclined downward from the high region part 41 toward the low region part 42.

An insulating layer 45 that covers the connection part 43 is formed on the semiconductor main surface 13. The insulating layer 45 may include a silicon oxide layer or a silicon nitride layer, or a stacked structure including a silicon oxide layer and a silicon nitride layer. In the present embodiment, the insulating layer 45 has a single layer structure formed of a silicon nitride layer.

The insulating layer 45 surrounds the high region part 41 in a plan view. The insulating layer 45 also covers the entire region of the connection part 43. The insulating layer 45 includes an overlap portion that covers the high region part 41 via an edge portion connecting the high region part 41 and the connection part 43. The insulating layer 45 includes an overlap portion that covers the low region part 42 via an edge portion connecting the low region part 42 and the connection part 43.

The n-side electrode 51 as an example of the electrode structure is formed on the semiconductor main surface 13. The n-side electrode 51 is formed in a region along at least one of the semiconductor side surfaces 14A to 14D in the low region part 42. In the present embodiment, the n-side electrode 51 is arranged in a region along a corner portion connecting the first semiconductor side surface 14A and the fourth semiconductor side surface 14D in the low region part 42. The n-side electrode 51 is electrically connected to the n-type semiconductor layer 22 (n-type contact layer 29).

More specifically, the n-side electrode 51 includes an ITO electrode 52 including indium tin oxide (ITO). The ITO electrode 52 covers the semiconductor main surface 13 (low region part 42) and is formed as a light-transmitting electrode configured to transmit light generated by the semiconductor light-emitting layer 7. The ITO electrode 52 is formed on the n-type semiconductor layer 22 (n-type contact layer 29). The ITO electrode 52 is electrically connected to the n-type semiconductor layer 22 (n-type contact layer 29).

The ITO electrode 52 has a first area Sn1 in a plan view. The ITO electrode 52 faces the protrusions 12 along the normal direction Z. Furthermore, the ITO electrode 52 faces the empty holes 25 formed in the buffer layer 21 along the normal direction Z.

In the present embodiment, the ITO electrode 52 includes a body 53 and a wiring 54. In the present embodiment, the body 53 is formed in a circular shape in a plan view. The planar shape of the body 53 is arbitrary and is not limited to a specific shape. The body 53 may be formed in a polygonal shape or an elliptical shape in a plan view.

The wiring 54 is a part drawn out in a band shape from the body 53. In the present embodiment, the wiring 54 is drawn out from the body 53 to a region along the first semiconductor side surface 14A in the low region part 42. The wiring 54 may be formed along two, three, or four of the semiconductor side surfaces 14A to 14D so as to partition the high region part 41 from two directions, three directions, or four directions in a plan view.

The thickness of the ITO electrode 52 may be 10 nm or more and 500 nm or less. The thickness of the ITO electrode 52 may be 10 nm or more and 100 nm or less, 100 nm or more and 200 nm or less, 200 nm or more and 300 nm or less, 300 nm or more and 400 nm or less, or 400 nm or more and 500 nm or less. In the present embodiment, the thickness of the ITO electrode 52 is 50 nm or more and 150 nm or less.

The n-side electrode 51 includes a wiring electrode 55 formed on the ITO electrode 52. The wiring electrode 55 is formed as an external terminal which is externally connected. The wiring electrode 55 has a second area Sn2 (where Sn2<Sn1) less than the first area Sn1 of the ITO electrode 52 in a plan view. The wiring electrode 55 is formed with an interval inward from the periphery of the ITO electrode 52.

The entire region of the wiring electrode 55 overlaps the ITO electrode 52 in a plan view. The wiring electrode 55 faces the protrusions 12 along the normal direction Z. Furthermore, the wiring electrode 55 faces the empty holes 25 formed in the buffer layer 21 along the normal direction Z.

The wiring electrode 55 includes a body 56 and a wiring 57. The body 56 is a part to which an electrically conductive bonding member such as a bonding wire or the like is connected. The body 56 is arranged on the body 53 of the ITO electrode 52. In the present embodiment, the body 56 is formed in a circular shape in a plan view. The planar shape of the body 56 is arbitrary and is not limited to a specific shape. The body 56 may be formed in a polygonal shape or an elliptical shape in a plan view.

The wiring 57 is a part drawn out in a band shape from the body 56. The wiring 57 is arranged on the wiring 54 of the ITO electrode 52. A forward voltage VF of the semiconductor light-emitting device 1 is adjusted by adjusting a manner of drawing the wiring 57 out.

The wiring 57 is drawn out from the body 56 to a region along the first semiconductor side surface 14A in the low region part 42. The wiring 57 may be formed along two, three, or four of the semiconductor side surfaces 14A to 14D so as to partition the high region part 41 from two directions, three directions, or four directions in a plan view.

The wiring electrode 55 is formed in a trapezoidal shape having a top 58, a base 59, and a sidewall 60 inclined downward from the top 58 toward the base 59 in a cross-sectional view. The wiring electrode 55 has a swelling 61 that protrudes outward at an edge portion connecting the top 58 and the sidewall 60.

The swelling 61 protrudes toward the normal direction Z and a direction along the top 58. The swelling 61 is formed in an annular shape extending along the periphery of the top 58 in a plan view. The swelling 61 defines a region to which an electrically conductive bonding member such as a bonding wire or the like is connected in the body 56.

In the present embodiment, the wiring electrode 55 has a stacked structure including an Al electrode 62, a Ti electrode 63, and a Au electrode 64, which are stacked sequentially from a side of the ITO electrode 52.

The Al electrode 62 includes aluminum (Al). The Al electrode 62 is formed of pure Al or an Al alloy. The Al alloy may be an AlCu alloy, an AlSi alloy, an AlSiCu alloy, or the like. In the present embodiment, the Al electrode 62 is formed of pure Al.

The Al electrode 62 is formed as a light-reflecting electrode that reflects the light generated by the semiconductor light-emitting layer 7. The Al electrode 62 is formed in a trapezoidal shape in a cross-sectional view. A sidewall of the Al electrode 62 has a first inclination angle θn1. The first inclination angle θn1 is an angle formed inside the Al electrode 62 by the sidewall of the Al electrode 62 with respect to the semiconductor main surface 13.

The thickness of the Al electrode 62 may be 100 nm or more and 1,500 nm or less. The thickness of the Al electrode 62 may be 100 nm or more and 250 nm or less, 250 nm or more and 500 nm or less, 500 nm or more and 750 nm or less, 750 nm or more and 1,000 nm or less, 1,000 nm or more and 1,250 nm or less, or 1,250 nm or more and 1,500 nm or less. In the present embodiment, the thickness of the Al electrode 62 is 250 nm or more and 350 nm or less. As the thickness of the Al electrode 62 increases, the reflectivity of light can be improved.

The Ti electrode 63 includes titanium (Ti). The Ti electrode 63 is formed as an adhesive layer that increases the adhesion of the Au electrode 64 to the Al electrode 62. The Ti electrode 63 covers substantially the entire region of the Al electrode 62. The Ti electrode 63 is formed in a trapezoidal shape in a cross-sectional view. A sidewall of the Ti electrode 63 covers the sidewall of the Al electrode 62.

The sidewall of the Ti electrode 63 has a second inclination angle θn2 (where θn1<θn2) exceeding the first inclination angle θn1 of the Al electrode 62. The second inclination angle θn2 is an angle formed inside the Ti electrode 63 by the sidewall of the Ti electrode 63 with respect to the semiconductor main surface 13.

The thickness of the Ti electrode 63 may be 100 nm or more and 500 nm or less. The thickness of the Ti electrode 63 may be 100 nm or more and 200 nm or less, 200 nm or more and 300 nm or less, 300 nm or more and 400 nm or less, or 400 nm or more and 500 nm or less. In the present embodiment, the thickness of the Ti electrode 63 is 150 nm or more and 250 nm or less.

The Au electrode 64 includes gold (Au). The Au electrode 64 covers substantially the entire region of the Ti electrode 63. The Au electrode 64 is formed in a trapezoidal shape in a cross-sectional view. The Au electrode 64 forms an outer surface of the wiring electrode 55. A sidewall of the Au electrode 64 covers the sidewall of the Ti electrode 63.

The sidewall of the Au electrode 64 has a third inclination angle θn3 (where θn1<θn2<θn3) exceeding the second inclination angle θn2 of the Ti electrode 63. The third inclination angle θn3 is an angle formed inside the Au electrode 64 by the sidewall of the Au electrode 64 with respect to the semiconductor main surface 13.

The thickness of the Au electrode 64 may be 1 μm or more and 5 μm or less. The thickness of the Au electrode 64 may be 1 μm or more and 2 μm or less, 2 μm or more and 3 μm or less, 3 μm or more and 4 μm or less, or 4 μm or more and 5 μm or less. In the present embodiment, the thickness of the Au electrode 64 is 1.5 μm or more and 2.5 μm or less.

The n-side electrode 51 further includes a barrier electrode 65 interposed in a region between the ITO electrode 52 and the wiring electrode 55 (Al electrode 62). The barrier electrode 65 is formed as a protective electrode that suppresses galvanic corrosion of the ITO electrode 52 due to Al of the Al electrode 62.

The barrier electrode 65 may include an electrode material having an ionization tendency smaller than that of the Al electrode 62. The barrier electrode 65 includes at least one of a TiN layer and a Cr layer. The barrier electrode 65 may have a single layer structure consisting of a TiN layer or a Cr layer. The Cr layer has a light transmissivity smaller than the TiN layer. Therefore, the barrier electrode 65 may be formed of a TiN layer having a relatively large light transmissivity.

The thickness of the barrier electrode 65 is less than the thickness of the ITO electrode 52. The thickness of the barrier electrode 65 is less than the thickness of the Al electrode 62. The thickness of the barrier electrode 65 may be 1 nm or more and 5 nm or less. The thickness of the barrier electrode 65 may be 1 nm or more and 2 nm or less, 2 nm or more and 3 nm or less, 3 nm or more and 4 nm or less, or 4 nm or more and 5 nm or less. In the present embodiment, the thickness of the barrier electrode 65 is 1.5 nm or more and 2.5 nm or less.

The barrier electrode 65 is formed over the entire region of the ITO electrode 52 facing the wiring electrode 55 in a plan view. That is, the barrier electrode 65 includes a body 66 and a wiring 67. The body 66 of the barrier electrode 65 is interposed in a region between the body 53 of the ITO electrode 52 and the body 56 of the wiring electrode 55. The wiring 67 of the barrier electrode 65 is interposed in a region between the wiring 54 of the ITO electrode 52 and the wiring 57 of the wiring electrode 55.

The barrier electrode 65 has a third area Sn3 (where Sn2<Sn3) exceeding the second area Sn2 of the wiring electrode 55 (Al electrode 62) in a plan view. The barrier electrode 65 faces the protrusions 12 along the normal direction Z. Furthermore, the barrier electrode 65 faces the empty holes 25 formed in the buffer layer 21 along the normal direction Z.

More specifically, the barrier electrode 65 includes a first region 68 and a second region 69. The first region 68 is interposed in a region between the ITO electrode 52 and the wiring electrode 55. The second region 69 is drawn out from the first region 68 to a region outside the wiring electrode 55 in a plan view.

The first region 68 is interposed in the entire region between the ITO electrode 52 and the wiring electrode 55. That is, the first region 68 is interposed in a region between the body 53 of the ITO electrode 52 and the body 56 of the wiring electrode 55. Furthermore, the first region 68 is interposed in a region between the wiring 54 of the ITO electrode 52 and the wiring 57 of the wiring electrode 55.

The second region 69 is formed in a band shape extending along the periphery of the wiring electrode 55 in a plan view. More specifically, the second region 69 is formed in an annular shape extending along the periphery of the wiring electrode 55 in a plan view. That is, the second region 69 is formed in a band shape extending along the body 56 and the wiring 57 of the wiring electrode 55 in a plan view, and surrounds the body 56 and the wiring 57 in a lump.

In the present embodiment, the periphery of the second region 69 is located in a region between the periphery of the ITO electrode 52 and the periphery of the wiring electrode 55 with an interval from the periphery of the ITO electrode 52. Accordingly, the second region 69 exposes a part of the ITO electrode 52.

The second region 69 has a lead-out length Ln exceeding the thickness of the barrier electrode 65. The lead-out length Ln may be 100 times or more of the thickness of the barrier electrode 65. The lead-out length Ln may exceed the thickness of the ITO electrode 52. The lead-out length Ln may exceed the thickness of the Al electrode 62. More specifically, the lead-out length Ln may be twice or more of the thickness of the Al electrode 62.

The lead-out length Ln may be 0.1 µm or more and 5 µm or less. The lead-out length Ln may be 0.1 µm or more and 1 µm or less, 1 µm or more and 2 µm or less, 2 µm or more and 3 µm or less, 3 µm or more and 4 µm or less, or 4 µm or more and 5 µm or less. In the present embodiment, the lead-out length Ln is 1 µm or more and 3 µm or less.

A p-side electrode 71 as an example of the electrode structure is formed on the semiconductor main surface 13. The p-side electrode 71 is arranged in the high region part 41. The p-side electrode 71 is electrically connected to the p-type semiconductor layer 24 (p-type contact layer 35).

More specifically, the p-side electrode 71 includes an ITO electrode 72 including indium tin oxide (ITO). The ITO electrode 72 is formed as a light-transmitting electrode that transmits the light generated by the semiconductor light-emitting layer 7. The ITO electrode 72 is formed on the p-type semiconductor layer 24 (p-type contact layer 35). The ITO electrode 72 is electrically connected to the p-type semiconductor layer 24 (p-type contact layer 35).

The ITO electrode 72 covers the inner region of the high region part 41 with an interval from the periphery of the high region part 41. The periphery of the ITO electrode 72 extends along the periphery of the high region part 41. The ITO electrode 72 has a first area Sp1 in a plan view. The ITO electrode 72 faces the protrusions 12 along the normal direction Z. Furthermore, the ITO electrode 72 faces the empty holes 25 formed in the buffer layer 21 along the normal direction Z.

The thickness of the ITO electrode 72 may be 10 nm or more and 500 nm or less. The thickness of the ITO electrode 72 may be 10 nm or more and 100 nm or less, 100 nm or more and 200 nm or less, 200 nm or more and 300 nm or less, 300 nm or more and 400 nm or less, or 400 nm or more and 500 nm or less.

In the present embodiment, the thickness of the ITO electrode 72 is 50 nm or more and 150 nm or less. The thickness of the ITO electrode 72 may be equal to the thickness of the ITO electrode 52 of the n-side electrode 51. When the thickness of the ITO electrode 72 is equal to the thickness of the ITO electrode 52, it means that the ITO electrode 72 is formed under a condition that the thickness of the ITO electrode 72 is substantially equal to the thickness of the ITO electrode 52. An error of about ±10% of the thickness of the ITO electrode 52 may occur in the thickness of the ITO electrode 72.

The p-side electrode 71 includes a wiring electrode 75 formed on the ITO electrode 72. The wiring electrode 75 is formed as an external terminal which is externally connected. The wiring electrode 75 has a second area Sp2 (where Sp2<Sp1) less than the first area Sp1 of the ITO electrode 72 in a plan view. The wiring electrode 75 is formed with an interval inward from the periphery of the ITO electrode 72.

The wiring electrode 75 is formed on the ITO electrode 72 in such a manner that the area of the exposed part of the ITO electrode 72 is equal to or larger than the area of the concealed part of the ITO electrode 72 in a plan view. Thus, the entire region of the wiring electrode 75 overlaps the ITO electrode 72 in a plan view. The wiring electrode 75 faces the protrusions 12 along the normal direction Z. Furthermore, the wiring electrode 75 faces the empty holes 25 formed in the buffer layer 21 along the normal direction Z.

The wiring electrode 75 includes a body 76 and a wiring 77. The body 76 is a part to which an electrically conductive bonding member such as a bonding wire or the like is connected. In the present embodiment, the body 76 is formed in a circular shape in a plan view. The planar shape of the body 76 is arbitrary and is not limited to a specific shape. The body 76 may be formed in a polygonal shape or an elliptical shape in a plan view.

The wiring 77 is a part drawn out in a band shape from the body 76. The forward voltage VF of the semiconductor light-emitting device 1 is adjusted by adjusting a manner of drawing the wiring 77 out. In the present embodiment, the wiring 77 is drawn out from a portion of the body 76 facing the n-side electrode 51.

In the present embodiment, the wiring 77 is formed in a circular arc shape curved in a direction away from the body 76 in a plan view, and is circumscribed to the body 76. More specifically, the wiring 77 includes a plurality of portions having different radii of curvature. The plurality of portions includes a first wiring portion 77a and a second wiring portion 77b.

The first wiring portion 77a extends in a circular arc shape centering around the body 56 of the n-side electrode 51 (wiring electrode 55) in a plan view, and is circumscribed to the body 76. The second wiring portion 77b extends in a circular arc shape centering around a tip end portion of the wiring 57 of the n-side electrode 51 (wiring electrode 55) in a plan view, and is connected to the first wiring portion 77a.

The wiring electrode 75 is formed in a trapezoidal shape having a top 78, a base 79, and a sidewall 80 inclined downward from the top 78 toward the base 79 in a cross-sectional view. The wiring electrode 75 has a swelling 81 at an edge portion connecting the top 78 and the sidewall 80.

The swelling 81 protrudes in the normal direction Z and a direction along the top 78. The swelling 81 is formed in an annular shape extending along the periphery of the top 78 in a plan view. The swelling 81 defines a region to which an electrically conductive bonding member such as a bonding wire or the like is connected in the body 76.

In the present embodiment, the wiring electrode 75 has a stacked structure including an Al electrode 82, a Ti electrode 83, and a Au electrode 84, which are stacked sequentially from a side of the ITO electrode 72.

The Al electrode 82 includes aluminum (Al). The Al electrode 82 may be formed of pure Al or an Al alloy. The Al alloy may be an AlCu alloy, an AlSi alloy, an AlSiCu alloy, or the like. The Al electrode 82 may be formed of the same electrode material as the Al electrode 62 of the n-side electrode 51. In the present embodiment, the Al electrode 82 is formed of pure Al.

The Al electrode 82 is formed as a light-reflecting electrode that reflects the light generated by the semiconductor light-emitting layer 7. The Al electrode 82 is formed in a trapezoidal shape in a cross-sectional view. A sidewall of the Al electrode 82 has a first inclination angle $\theta p1$. The first inclination angle $\theta p1$ is an angle formed inside the Al electrode 82 by the sidewall of the Al electrode 82 with respect to the semiconductor main surface 13.

The thickness of the Al electrode 82 may be 100 nm or more and 1,500 nm or less. The thickness of the Al electrode 82 may be 100 nm or more and 250 nm or less, 250 nm or more and 500 nm less, 500 nm or more and 750 nm or less, 750 nm or more and 1,000 nm or less, 1,000 nm or more and 1,250 nm or less, or 1,250 nm or more and 1,500 nm or less.

In the present embodiment, the thickness of the Al electrode 82 is 250 nm or more and 350 nm or less. As the thickness of the Al electrode 82 increases, the reflectivity of light can be improved. The thickness of the Al electrode 82 may be equal to the thickness of the Al electrode 62 of the n-side electrode 51. When the thickness of the Al electrode 82 is equal to the thickness of the Al electrode 62, it means that the Al electrode 82 is formed under a condition that the thickness of the Al electrode 82 is substantially equal to the thickness of the Al electrode 62. An error of about ±10% of the thickness of the Al electrode 62 may occur in the thickness of the Al electrode 82.

The Ti electrode 83 includes titanium (Ti). The Ti electrode 83 is formed as an adhesive layer that increases the adhesion of the Au electrode 84 to the Al electrode 82. The Ti electrode 83 covers substantially the entire region of the Al electrode 82. The Ti electrode 83 is formed in a trapezoidal shape in a sectional view. A sidewall of the Ti electrode 83 covers the sidewall of the Al electrode 82.

The sidewall of the Ti electrode 83 has a second inclination angle $\theta p2$ (where $\theta p1 < \theta p2$) exceeding the first inclination angle $\theta p1$ of the Al electrode 82. The second inclination angle $\theta p2$ is an angle formed inside the Ti electrode 83 by the sidewall of the Ti electrode 83 with respect to the semiconductor main surface 13.

The thickness of the Ti electrode 83 may be 100 nm or more and 500 nm or less. The thickness of the Ti electrode 83 may be 100 nm or more and 200 nm or less, 200 nm or more and 300 nm or less, 300 nm or more and 400 nm or less, or 400 nm or more and 500 nm or less.

In the present embodiment, the thickness of the Ti electrode 83 is 150 nm or more and 250 nm or less. The thickness of the Al electrode 82 may be equal to the thickness of the Ti electrode 63 of the n-side electrode 51. When the thickness of the Ti electrode 83 is equal to the thickness of the Ti electrode 63, it means that the Ti electrode 83 is formed under a condition that the thickness of the Ti electrode 83 is substantially equal to the thickness of the Ti electrode 63. An error of about ±10% of the thickness of the Ti electrode 63 may occur in the thickness of the Ti electrode 83.

The Au electrode 84 includes gold (Au). The Au electrode 84 covers substantially the entire region of the Ti electrode 83. The Au electrode 84 is formed in a trapezoidal shape in a cross-sectional view. The Au electrode 84 forms an outer surface of the wiring electrode 75. A sidewall of the Au electrode 84 covers the sidewall of the Ti electrode 83.

The sidewall of the Au electrode 84 has a third inclination angle $\theta p3$ (where $\theta p1 < \theta p2 < \theta p3$) exceeding the second inclination angle $\theta p2$ of the Ti electrode 83. The third inclination angle $\theta p3$ is an angle formed inside the Au electrode 84 by the sidewall of the Au electrode 84 with respect to the semiconductor main surface 13.

The thickness of the Au electrode 84 may be 1 μm or more and 5 μm or less. The thickness of the Au electrode 84 may be 1 μm or more and 2 μm or less, 2 μm or more and 3 μm or less, 3 μm or more and 4 μm or less, or 4 μm or more and 5 μm or less.

In the present embodiment, the thickness of the Au electrode 84 is 1.5 μm or more and 2.5 μm or less. The thickness of the Au electrode 84 may be equal to the thickness of the Au electrode 64 of the n-side electrode 51. When the thickness of the Au electrode 84 is equal to the thickness of the Au electrode 64, it means that the Au electrode 84 is formed under a condition that the thickness of the Au electrode 84 is substantially equal to the thickness of the Au electrode 64. An error of about ±10% of the thickness of the Au electrode 64 may occur in the thickness of the Au electrode 84.

The p-side electrode 71 further includes a barrier electrode 85 interposed in a region between the ITO electrode 72 and the wiring electrode 75 (Al electrode 82). The barrier electrode 85 is formed as a protective electrode that suppresses galvanic corrosion of the ITO electrode 72 due to Al of the Al electrode 82.

The barrier electrode 85 may include an electrode material having an ionization tendency smaller than that of the Al electrode 82. The barrier electrode 85 includes at least one of a TiN layer and a Cr layer. The barrier electrode 85 may have a single layer structure consisting of a TiN layer or a Cr layer. The Cr layer has a light transmissivity smaller than the TiN layer. Therefore, the barrier electrode 85 may be formed of a TiN layer having a relatively large light transmissivity.

The thickness of the barrier electrode 85 is less than the thickness of the ITO electrode 72. The thickness of the barrier electrode 85 is less than the thickness of the Al electrode 82. The thickness of the barrier electrode 85 may be 1 nm or more and 5 nm or less. The thickness of the barrier electrode 85 may be 1 nm or more and 2 nm or less, 2 nm or more and 3 nm or less, 3 nm or more and 4 nm or less, or 4 nm or more and 5 nm or less.

In the present embodiment, the thickness of the barrier electrode 85 is 1.5 nm or more and 2.5 nm or less. The thickness of the barrier electrode 85 may be equal to the thickness of the barrier electrode 65 of the n-side electrode 51. When the thickness of the barrier electrode 85 is equal to the thickness of the barrier electrode 65, it means that the barrier electrode 85 is formed under a condition that the thickness of the barrier electrode 85 is substantially equal to the thickness of the barrier electrode 65. An error of about ±10% of the thickness of the barrier electrode 65 may occur in the thickness of the barrier electrode 85.

The barrier electrode 85 is formed over the entire region of the ITO electrode 72 facing the wiring electrode 75 in a plan view. That is, the barrier electrode 85 includes a body 86 and a wiring 87. The body 86 of the barrier electrode 85 is interposed in a region between the ITO electrode 72 and the body 76 of the wiring electrode 75. The wiring 87 of the barrier electrode 85 is interposed in a region between the ITO electrode 52 and the wiring 77 of the wiring electrode 75.

The barrier electrode 85 has a third area Sp3 (where Sp2<Sp3) exceeding the second area Sp2 of the wiring electrode 75 (Al electrode 82) in a plan view. The barrier electrode 85 faces the protrusions 12 along the normal direction Z. Furthermore, the barrier electrode 85 faces the empty holes 25 formed in the buffer layer 21 along the normal direction Z.

More specifically, the barrier electrode 85 includes a first region 88 and a second region 89. The first region 88 is interposed in a region between the ITO electrode 72 and the wiring electrode 75. The second region 89 is drawn out from the first region 88 to a region outside the wiring electrode 75 in a plan view.

The first region 88 is interposed in the entire region between the ITO electrode 72 and the wiring electrode 75. That is, the first region 88 is interposed in a region between the ITO electrode 72 and the body 76 of the wiring electrode 75. Furthermore, the first region 88 is interposed in a region between the ITO electrode 72 and the wiring 77 of the wiring electrode 75.

The second region 89 is formed in a band shape extending along the periphery of the wiring electrode 75 in a plan view. More specifically, the second region 89 is formed in an annular shape extending along the periphery of the wiring electrode 75 in a plan view. That is, the second region 89 is formed in a band shape extending along the body 76 and the wiring 77 of the wiring electrode 75 in a plan view, and surrounds the body 76 and the wiring 77 in a lump.

In the present embodiment, the periphery of the second region 89 is located in a region between the periphery of the ITO electrode 72 and the periphery of the wiring electrode 75 with an interval from the periphery of the ITO electrode 72. Accordingly, the second region 89 exposes a part of the ITO electrode 72.

The second region 89 has a lead-out length Lp exceeding the thickness of the barrier electrode 85. The lead-out length Lp is preferably 100 times or more of the thickness of the barrier electrode 85. The lead-out length Lp may exceed the thickness of the ITO electrode 72. The lead-out length Lp may exceed the thickness of the Al electrode 82. More specifically, the lead-out length Lp may be twice or more of the thickness of the Al electrode 82.

The lead-out length Lp may be 0.1 µm or more and 5 µm or less. The lead-out length Lp may be 0.1 µm or more and 1 µm or less, 1 µm or more and 2 µm or less, 2 µm or more and 3 µm or less, 3 µm or more and 4 µm or less, or 4 µm or more and 5 µm or less. In the present embodiment, the lead-out length Lp is 1 µm or more and 3 µm or less.

When the forward voltage VF is applied between the n-side electrode 51 and the p-side electrode 71, electrons are supplied from the n-type semiconductor layer 22 to the active layer 23, and holes are supplied from the p-type semiconductor layer 24 to the active layer 23. The electrons and holes supplied to the active layer 23 are combined in the active layer 23 to thereby generate light.

As described above, the semiconductor light-emitting device 1 includes the n-side electrode 51 formed on the semiconductor main surface 13 (low region part 42) of the semiconductor light-emitting layer 7. The n-side electrode 51 includes the barrier electrode 65 interposed in a region between the ITO electrode 52 and the Al electrode 62. Accordingly, it is possible to suppress the galvanic corrosion of the ITO electrode 52 due to Al of the Al electrode 62 by the barrier electrode 65.

As a result, the light generated by the semiconductor light-emitting layer 7 may be appropriately incident on the Al electrode 62 via the ITO electrode 52, and the light reflected by the Al electrode 62 may be appropriately incident on the semiconductor light-emitting layer 7 via the ITO electrode 52. Thus, it is possible to provide the semiconductor light-emitting device 1 capable of enhancing light extraction efficiency.

In particular, the semiconductor light-emitting device 1 includes the uneven structure 11 formed on the first substrate main surface 8 of the substrate 6. Thus, the light generated by the semiconductor light-emitting layer 7 and the light reflected by the Al electrode 62 can be diffusely reflected toward the semiconductor light-emitting layer 7. As a result, it is possible to appropriately enhance the light extraction efficiency.

In addition, the barrier electrode 65 includes the first region 68 and the second region 69. The first region 68 is interposed in a region between the ITO electrode 52 and the Al electrode 62. The second region 69 is drawn out from the first region 68 to a region outside the Al electrode 62 in a plan view.

The galvanic corrosion tends to occur in the ITO electrode 52 starting from the periphery of the Al electrode 62. Therefore, it is possible to appropriately suppress the galvanic corrosion of the ITO electrode 52 starting from the periphery of the Al electrode 62 by drawing out the barrier electrode 65 to a region outside the Al electrode 62. Furthermore, it is possible to enhance the effects of suppressing galvanic corrosion by forming the second region 69 so as to surround the periphery of the Al electrode 62 in a plan view.

Moreover, the Al electrode 62 is formed in a trapezoidal shape in a cross-sectional view. Thus, it is possible to reduce a volume of a portion that forms the periphery in the Al electrode 62. As a result, it is possible to appropriately suppress the galvanic corrosion of the ITO electrode 52 starting from the periphery of the Al electrode 62 using the structure of the Al electrode 62.

Furthermore, the semiconductor light-emitting device 1 includes the p-side electrode 71 formed on the semiconductor main surface 13 (high region part 41) of the semiconductor light-emitting layer 7. The p-side electrode 71 includes the barrier electrode 85 interposed in a region between the ITO electrode 72 and the Al electrode 82. Thus, it is possible to suppress the galvanic corrosion of the ITO electrode 72 due to Al of the Al electrode 82 by the barrier electrode 85.

As a result, the light generated by the semiconductor light-emitting layer 7 may be appropriately incident on the Al electrode 82 via the ITO electrode 72 and the light reflected by the Al electrode 82 may be appropriately incident on the semiconductor light-emitting layer 7 via the ITO electrode 72. Thus, it is possible to provide the semiconductor light-emitting device 1 capable of enhancing the light extraction efficiency.

In particular, the semiconductor light-emitting device 1 includes the uneven structure 11 formed on the first substrate main surface 8 of the substrate 6. Thus, the light generated by the semiconductor light-emitting layer 7 and the light reflected by the Al electrode 82 can be diffusely reflected toward the semiconductor light-emitting layer 7. As a result, it is possible to appropriately enhance the light extraction efficiency.

In addition, the barrier electrode 85 includes the first region 88 and the second region 89. The first region 88 is interposed in a region between the ITO electrode 72 and the Al electrode 82. The second region 89 is drawn out from the first region 88 to a region outside the Al electrode 82 in a plan view.

The galvanic corrosion tends to occur in the ITO electrode 72 starting from the periphery of the Al electrode 82. Therefore, it is possible to appropriately suppress the galvanic corrosion of the ITO electrode 72 starting from the periphery of the Al electrode 82 by drawing out the barrier electrode 85 to a region outside the Al electrode 82. Furthermore, it is possible to enhance the effects of suppressing galvanic corrosion by forming the second region 89 so as to surround the periphery of the Al electrode 82 in a plan view.

Moreover, the Al electrode 82 is formed in a trapezoidal shape in a cross-sectional view. Thus, it is possible to reduce a volume of a portion that forms the periphery in the Al electrode 82. As a result, it is possible to appropriately suppress the galvanic corrosion of the ITO electrode 72 starting from the periphery of the Al electrode 82 using the structure of the Al electrode 82.

FIGS. 8A to 8M are cross-sectional views of a region corresponding to FIG. 3, and are cross-sectional views illustrating an example of a method of manufacturing the semiconductor light-emitting device 1 shown in FIG. 1.

Referring to FIG. 8A, first, the substrate 6 formed of a sapphire substrate is prepared. Next, a base insulating layer 91 serving as a base of the protrusions 12 is formed on the first substrate main surface 8 of the substrate 6. The base insulating layer 91 includes silicon oxide or silicon nitride. The base insulating layer 91 may be formed by a chemical vapor deposition (CVD) method.

Figure 8B:
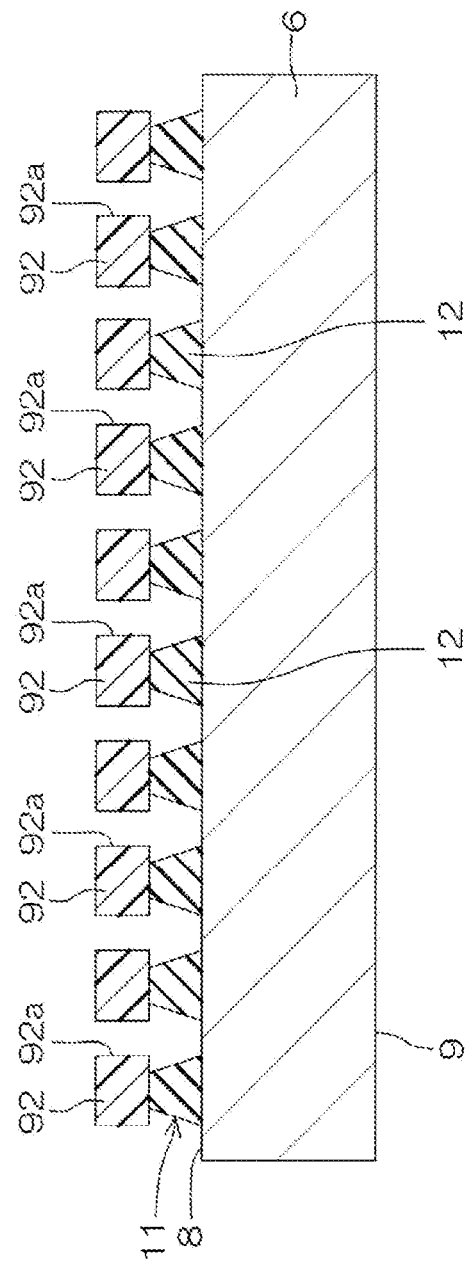
FIG. 8B is a cross-sectional view illustrating a next step of FIG. 8A.

Next, referring to FIG. 8B, a mask 92 having a predetermined pattern is formed on the base insulating layer 91. The mask 92 has openings 92a, which cover regions where the protrusions 12 are to be formed and expose other regions.

Next, unnecessary portions of the base insulating layer 91 are removed by an etching method via the mask 92. The etching method may be a wet etching method and/or a dry etching method. Thus, the protrusions 12 are formed. The mask 92 is then removed.

Next, referring to FIG. 8C, the first buffer layer 26 that becomes a part of the buffer layer 21 is formed on the first substrate main surface 8 of the substrate 6. The first buffer layer 26 is formed by epitaxially growing GaN from the first substrate main surface 8 of the substrate 6. The first buffer layer 26 is formed in a region on a side of the first substrate main surface 8 of the substrate 6 with respect to the top of the protrusions 12.

Next, referring to FIG. 8D, the second buffer layer 27 that becomes a part of the buffer layer 21 is formed on the first buffer layer 26. The second buffer layer 27 is formed by three-dimensionally epitaxially growing GaN from the first buffer layer 26.

The second buffer layer 27 is formed so as to protrude upward from the tops of the protrusions 12. The second buffer layer 27 is formed so as to expose at least the tops of the protrusions 12. In the present embodiment, the second buffer layer 27 exposes the tops and parts of sidewalls of the protrusions 12.

Next, referring to FIG. 8E, the third buffer layer 28 that becomes a part of the buffer layer 21 is formed on the second buffer layer 27. The third buffer layer 28 is formed by two-dimensionally epitaxially growing GaN from the second buffer layer 27.

The third buffer layer 28 covers the second buffer layer 27 and the protrusions 12. The third buffer layer 28 partitions the empty holes 25, together with the tops of the protrusions 12. Thus, the buffer layer 21 including the first buffer layer 26, the second buffer layer 27, and the third buffer layer 28 is formed on the first substrate main surface 8 of the substrate 6.

Figure 8F:
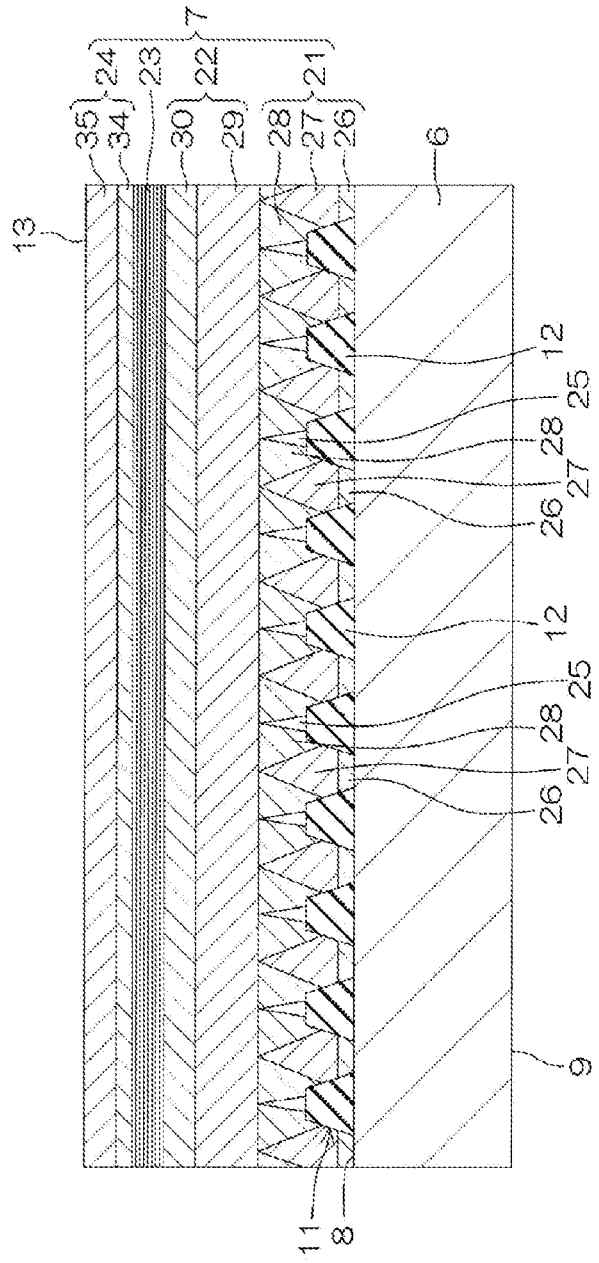
FIG. 8F is a cross-sectional view illustrating a next step of FIG. 8E.

Next, referring to FIG. 8F, the n-type semiconductor layer 22 is formed on the buffer layer 21. A process of forming the n-type semiconductor layer 22 includes a process of forming the n-type contact layer 29 and a process of forming the n-type clad layer 30.

The process of forming the n-type contact layer 29 includes a process of epitaxially growing GaN from the buffer layer 21. The process of forming the n-type contact layer 29 includes a process of adding an n-type impurity to GaN. The process of forming the n-type contact layer 29 may include a process of adding an n-type impurity to GaN simultaneously with the epitaxial growth of GaN.

The process of forming the n-type clad layer 30 includes a process of epitaxially growing GaN from the n-type contact layer 29. The process of forming the n-type clad layer 30 includes a process of adding an n-type impurity to GaN. The process of forming the n-type clad layer 30 may include a process of adding an n-type impurity to GaN simultaneously with the epitaxial growth of GaN.

Next, the active layer 23 is formed on the n-type semiconductor layer 22. A process of forming the active layer 23 includes a process of alternately stacking the barrier layers 32 and the well layers 33. A process of forming the barrier layers 32 includes a process of epitaxially growing AlGaN. The process of forming the barrier layers 32 may include a process of adding silicon to AlGaN. The process of forming the barrier layers 32 may include a process of adding silicon to AlGaN simultaneously with the epitaxial growth of AlGaN. A process of forming the well layers 33 includes a process of epitaxially growing AlInGaN.

Next, the p-type semiconductor layer 24 is formed on the active layer 23. A process of forming the p-type semiconductor layer 24 includes a process of forming the p-type clad layer 34 and a process of forming the p-type contact layer 35. The process of forming the p-type clad layer 34 includes a process of epitaxially growing AlGaN from the active layer 23. The process of forming the p-type clad layer 34 includes a process of adding a p-type impurity to AlGaN. The process of forming the p-type clad layer 34 may include a process of adding a p-type impurity to AlGaN simultaneously with the epitaxial growth of AlGaN.

The process of forming the p-type contact layer 35 includes a process of epitaxially growing GaN from the p-type clad layer 34. The process of forming the p-type contact layer 35 includes a process of adding a p-type impurity to GaN. The process of forming the p-type contact layer 35 may include a process of adding a p-type impurity to GaN simultaneously with the epitaxial growth of GaN. Thus, the semiconductor light-emitting layer 7 including the buffer layer 21, the n-type semiconductor layer 22, the active layer 23, and the p-type semiconductor layer 24 is formed on the first substrate main surface 8 of the substrate 6.

Figure 8G:
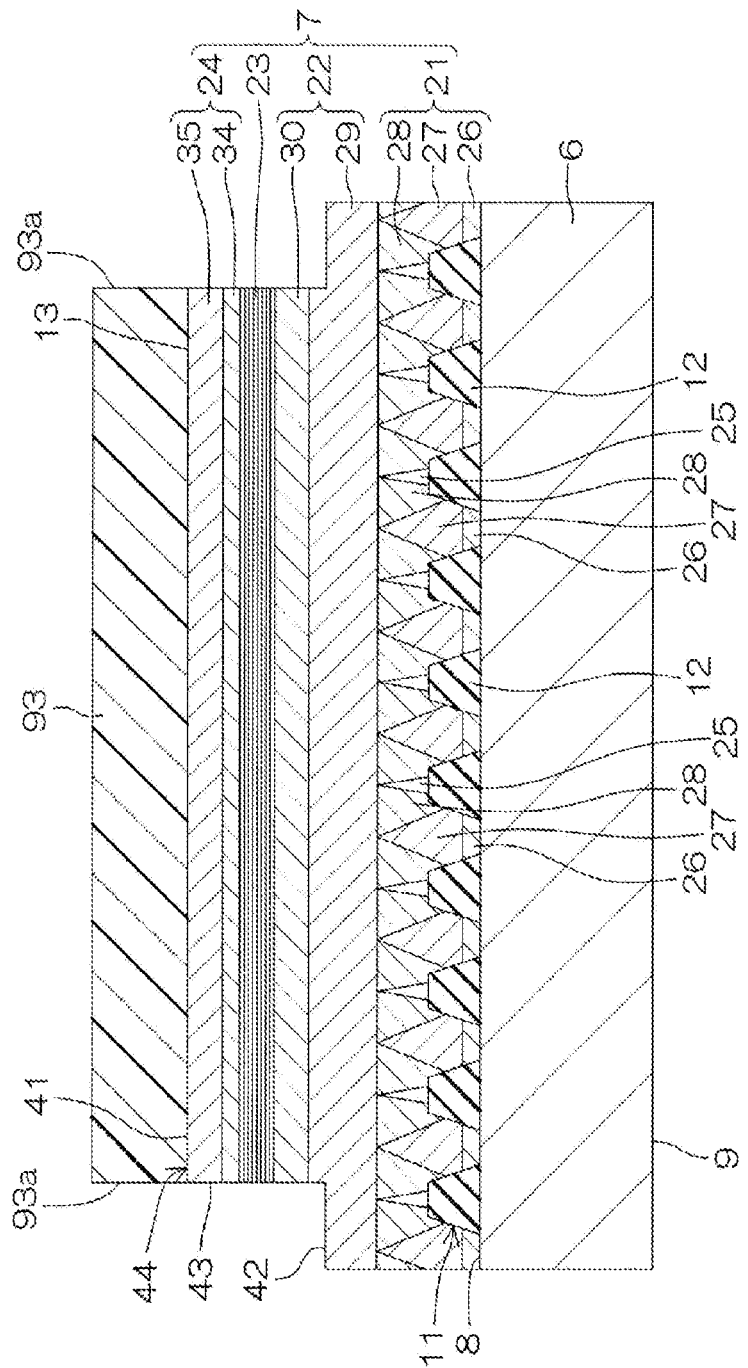
FIG. 8G is a cross-sectional view illustrating a next step of FIG. 8F.

Next, referring to FIG. 8G, a mask 93 having a predetermined pattern is formed on the semiconductor main surface 13. The mask 93 covers a region where the high region part 41 is to be formed, and has openings 93a exposing a region where the low region part 42 is to be formed.

Next, unnecessary portions of the semiconductor light-emitting layer 7 are removed by an etching method via the mask 93. The etching method may be a wet etching method and/or a dry etching method. Thus, the high region part 41, the low region part 42, and the connection part 43 are formed in the semiconductor light-emitting layer 7. The mask 93 is then removed.

Figure 8H:
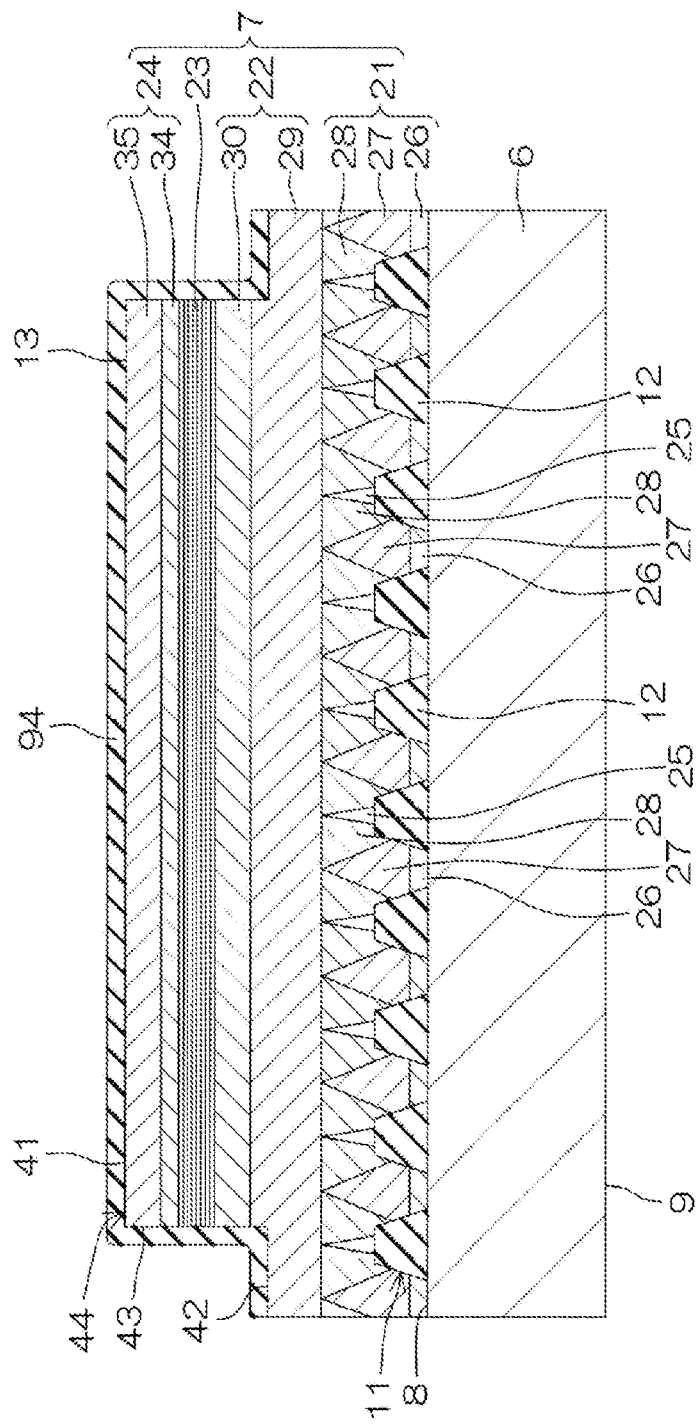
FIG. 8H is a cross-sectional view illustrating a next step of FIG. 8G.

Next, referring to FIG. 8H, a base insulating layer 94 serving as a base of the insulating layer 45 is formed on the semiconductor main surface 13. In the present embodiment, the base insulating layer 94 has a single layer structure consisting of a silicon nitride layer. The base insulating layer 94 is formed in a film shape along the high region part 41, the low region part 42, and the connection part 43. The base insulating layer 94 may be formed by a CVD method.

Figure 8I:
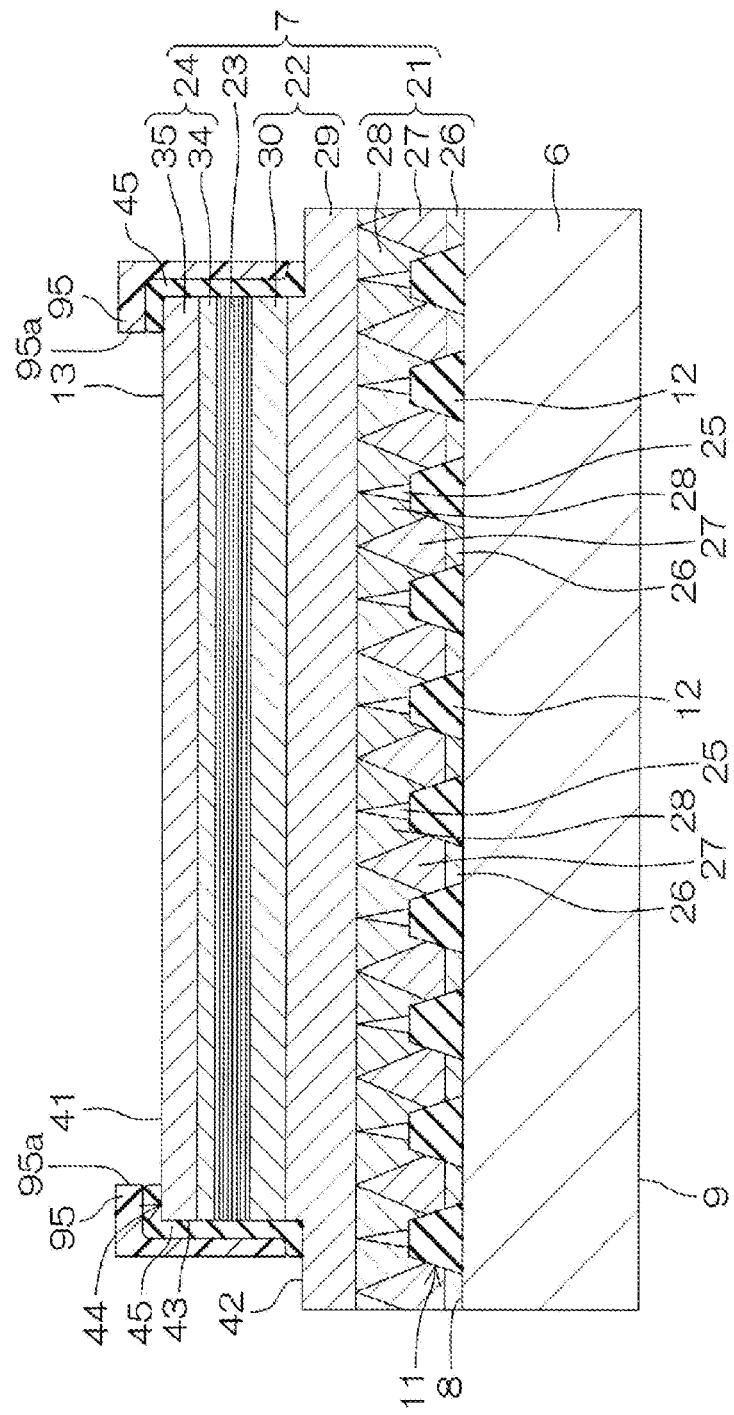
FIG. 8I is a cross-sectional view illustrating a next step of FIG. 8H.

Next, referring to FIG. 8I, masks 95 each of which has a predetermined pattern are formed on the base insulating layer 94. Each of the masks 95 covers a region where the insulating layer 45 is to be formed, and has an opening 95a exposing other regions.

Next, unnecessary portions of the base insulating layer 94 are removed by an etching method via the masks 95. The etching method may be a wet etching method and/or a dry etching method. Thus, the insulating layer 45 covering the connection part 43 of the semiconductor main surface 13 is formed. The masks 95 are then removed.

Figure 8J:
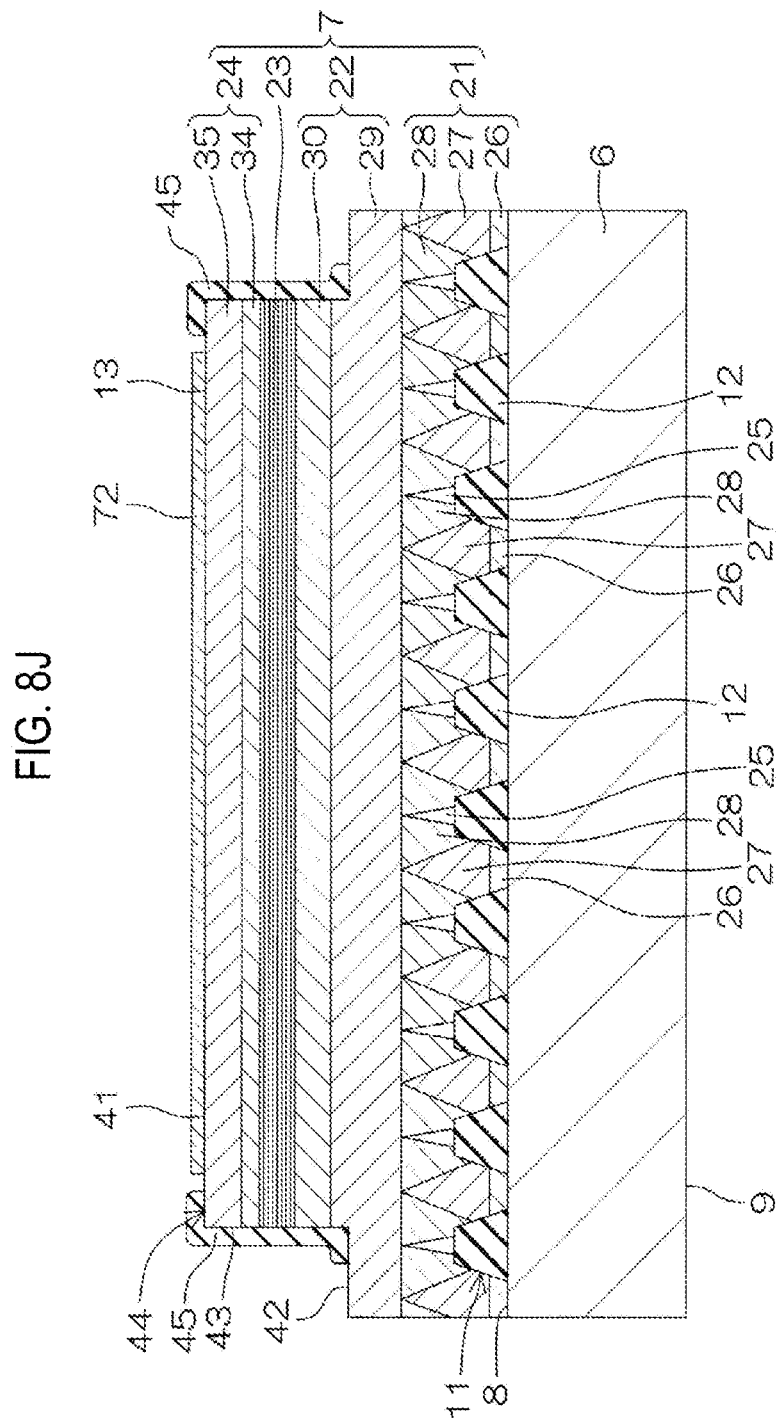
FIG. 8J is a cross-sectional view illustrating a next step of FIG. 8I.

Next, referring to FIG. 8J, the ITO electrode 52 of the n-side electrode 51 is formed in the low region part 42, and the ITO electrode 72 of the p-side electrode 71 is formed in the high region part 41. The ITO electrode 52 and the ITO electrode 72 may be formed by a lift-off method.

Next, referring to FIG. 8K, a base barrier electrode 96 serving as a base of the barrier electrode 65 of the n-side electrode 51 and the barrier electrode 85 of the p-side electrode 71 is formed on the semiconductor main surface 13. The base barrier electrode 96 is formed in a film shape covering the ITO electrode 52 and the ITO electrode 72 in a lump.

The base barrier electrode 96 includes at least one of a TiN layer and a Cr layer. The base barrier electrode 96 may have a single layer structure consisting of a TiN layer or a Cr layer. The Cr layer has a light transmissivity smaller than the TiN layer. Therefore, the base barrier electrode 96 may be formed of a TiN layer having a relatively large light transmissivity. The base barrier electrode 96 may be formed by a sputtering method.

Figure 8L:
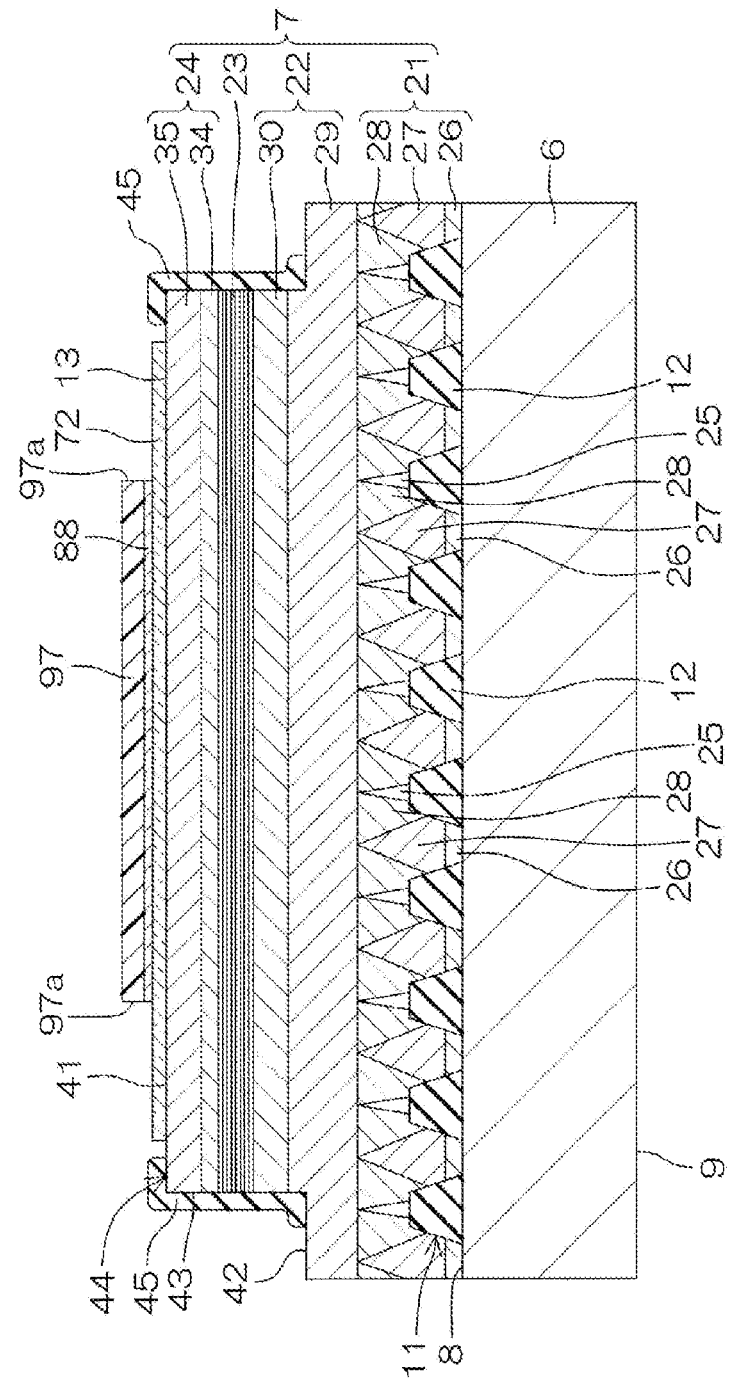
FIG. 8L is a cross-sectional view illustrating a next step of FIG. 8K.

Next, referring to FIG. 8L, a mask 97 having a predetermined pattern is formed on the base barrier electrode 96. The mask 97 covers regions where the barrier electrode 65 and the barrier electrode 85 are to be formed and has openings 97a exposing other regions.

Next, unnecessary portions of the base barrier electrode 96 are removed by an etching method via the mask 97. The etching method may be a wet etching method and/or a dry etching method. Thus, the barrier electrode 65 is formed on the ITO electrode 52, and the barrier electrode 85 is formed on the ITO electrode 72. The mask 97 is then removed.

Figure 8M:
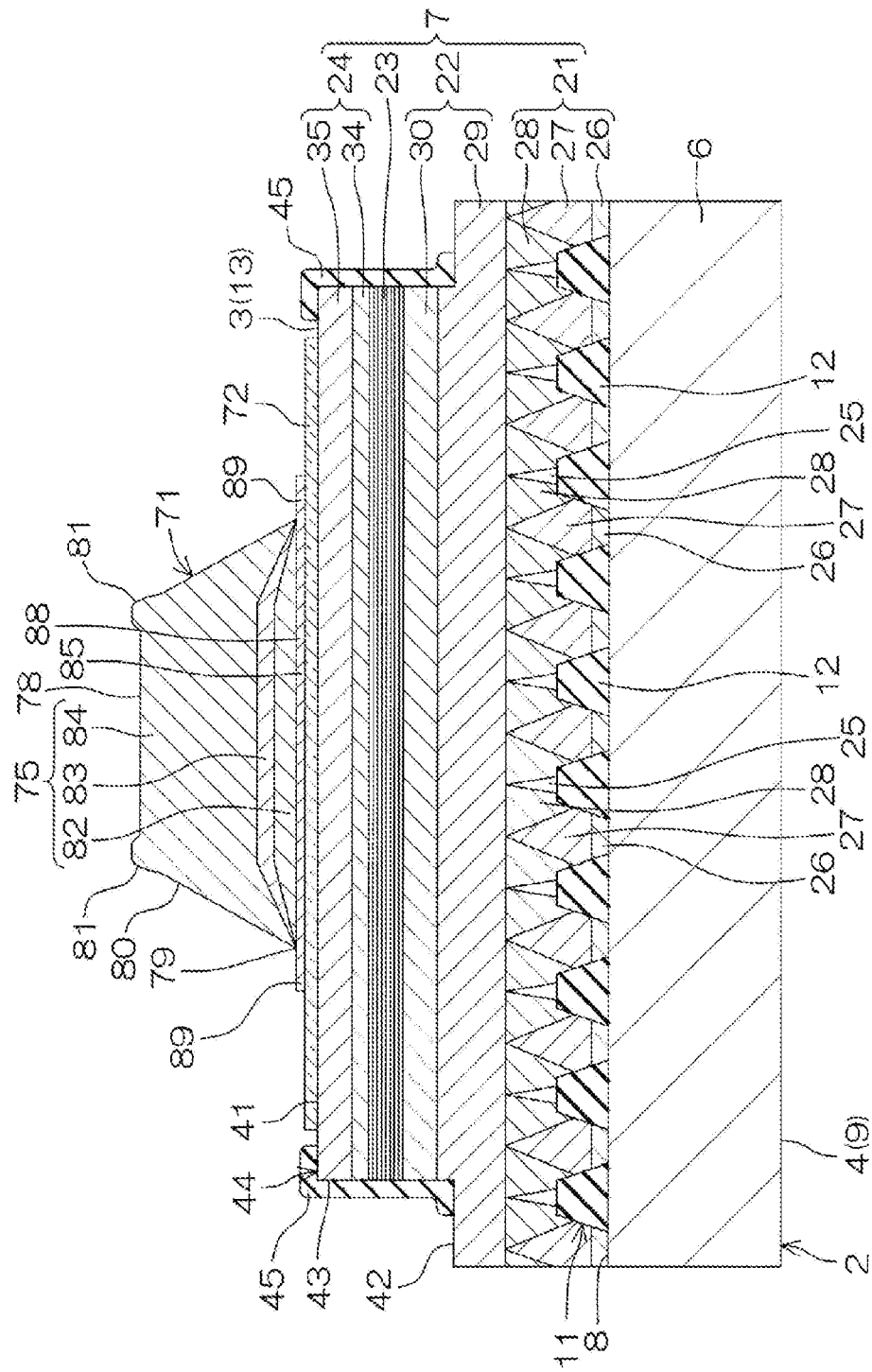
FIG. 8M is a cross-sectional view illustrating a next step of FIG. 8L.

Next, referring to FIG. 8M, the Ti electrode 63 and the Au electrode 64 of the n-side electrode 51 are formed on the barrier electrode 65, and the Ti electrode 83 and the Au electrode 84 of the p-side electrode 71 are formed on the barrier electrode 85.

The Ti electrode 63 and the Ti electrode 83 are respectively formed on the barrier electrode 65 and the barrier electrode 85 by a lift-off method. The Au electrode 64 and the Au electrode 84 are respectively formed on the Ti electrode 63 and the Ti electrode 83 by a lift-off method.

The Ti electrode 63 and the Ti electrode 83 as well as the Au electrode 64 and the Au electrode 84 may be formed using a common mask. The semiconductor light-emitting device 1 is manufactured through a process including the above processes.

Figure 9:
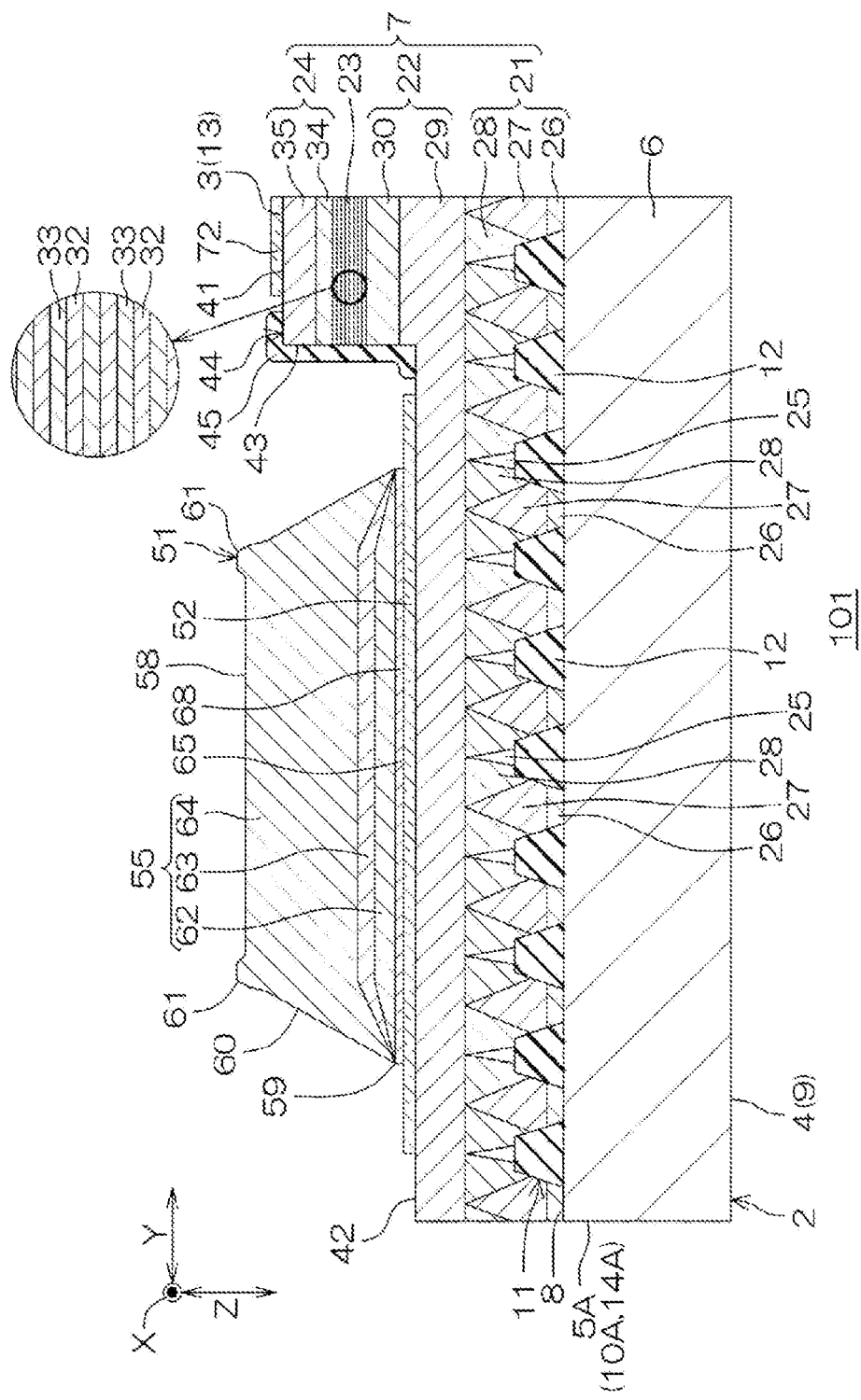
FIG. 9 is a cross-sectional view of a region corresponding to FIG. 2, and is a cross-sectional view illustrating a semiconductor light-emitting device according to a second embodiment of the present disclosure.
Figure 10:
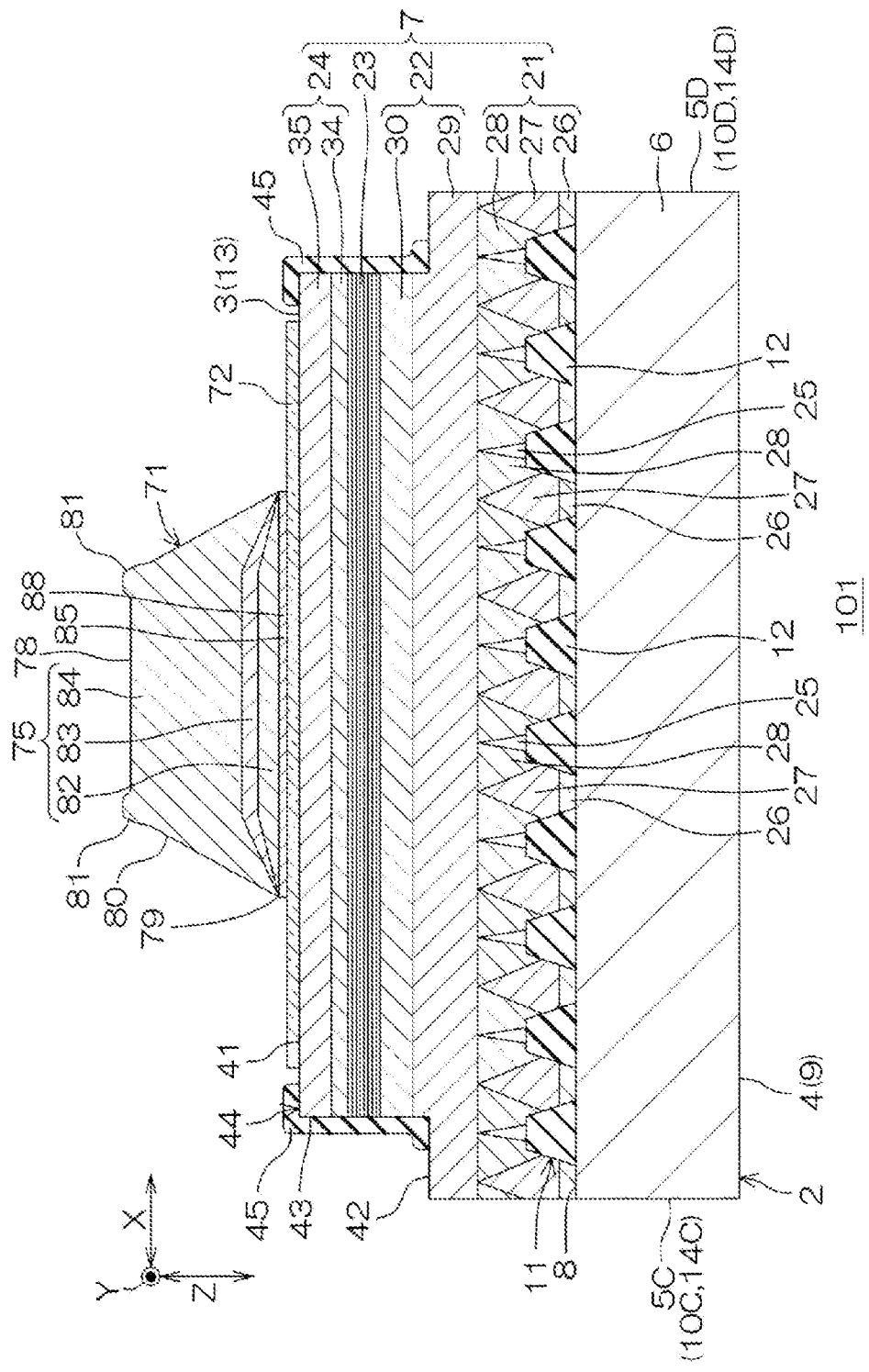
FIG. 10 is a cross-sectional view of a region corresponding to FIG. 3, and is a cross-sectional view illustrating the semiconductor light-emitting device shown in FIG. 9.

FIG. 9 is a cross-sectional view of a region corresponding to FIG. 2, and is a cross-sectional view illustrating a semiconductor light-emitting device 101 according to a second embodiment of the present disclosure. FIG. 10 is a cross-sectional view of a region corresponding to FIG. 3, and is a cross-sectional view illustrating the semiconductor light-emitting device 101 shown in FIG. 9. Hereinafter, structures corresponding to the structures described for the semiconductor light-emitting device 1 are denoted by like reference numerals and a description thereof will be omitted.

Referring to FIG. 9, the barrier electrode 65 of the n-side electrode 51 according to the semiconductor light-emitting device 101 does not have the second region 69. The barrier electrode 65 is interposed only in a region between the ITO electrode 52 and the wiring electrode 55. The periphery of the barrier electrode 65 may be located inside the wiring electrode 55 with respect to the periphery of the wiring electrode 55 in a plan view. The periphery of the barrier electrode 65 may be formed flush with the periphery of the wiring electrode 55.

Referring to FIG. 10, the barrier electrode 85 of the p-side electrode 71 according to the semiconductor light-emitting device 101 does not have the second region 89. The barrier electrode 85 is interposed only in a region between the ITO electrode 72 and the wiring electrode 75. The periphery of the barrier electrode 85 may be located inside the wiring electrode 75 with respect to the periphery of the wiring electrode 75 in a plan view. The periphery of the barrier electrode 85 may be formed flush with the periphery of the wiring electrode 75.

As described above, according to the semiconductor light-emitting device 101, the same effects as those described for the semiconductor light-emitting device 1 may be achieved except the effects by the second region 69 of the barrier electrode 65 and the effects by the second region 89 of the barrier electrode 85.

Figure 11:
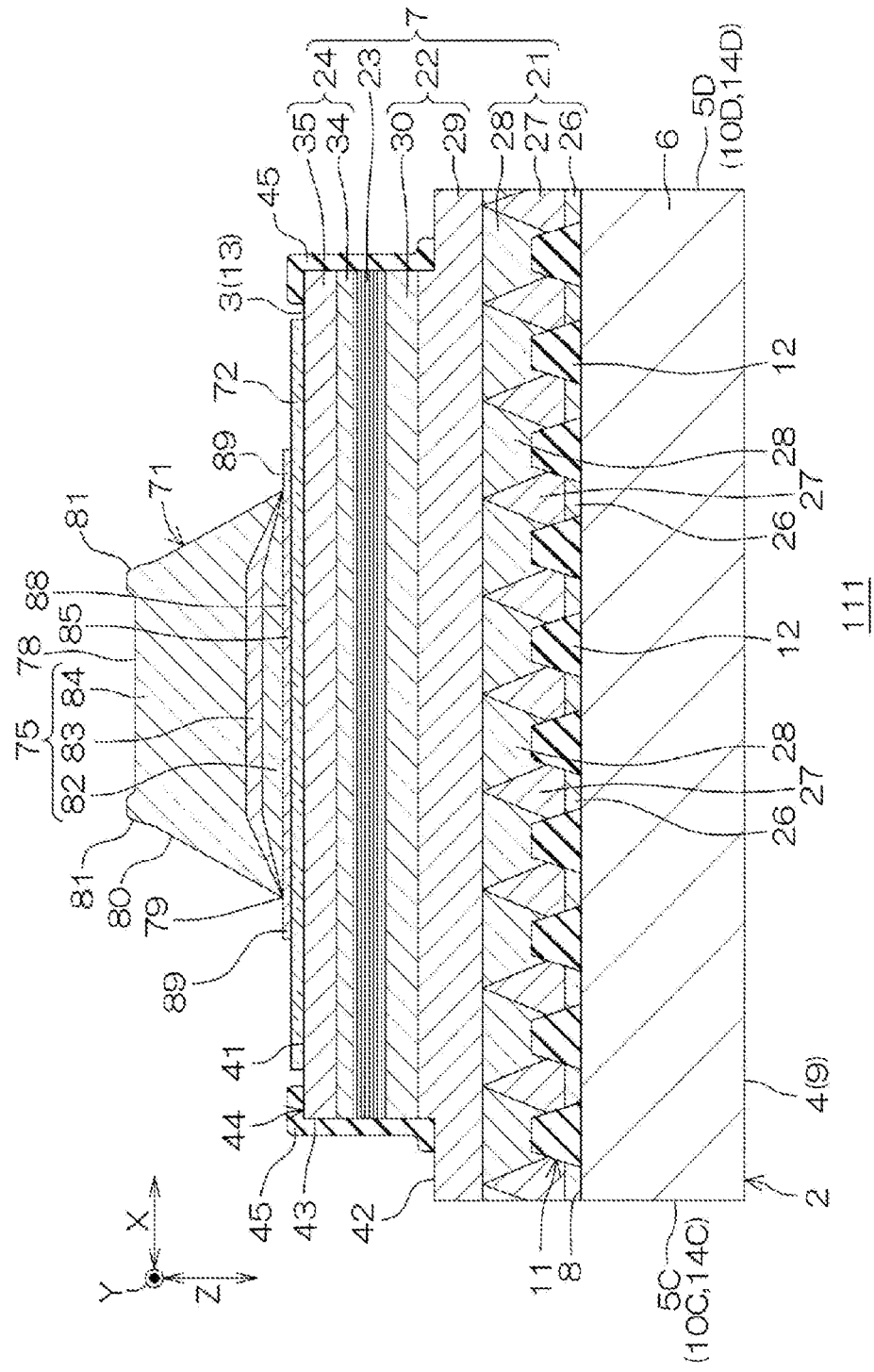
FIG. 11 is a cross-sectional view of a region corresponding to FIG. 3, and is a cross-sectional view illustrating a semiconductor light-emitting device according to a third embodiment of the present disclosure.

FIG. 11 is a cross-sectional view of a region corresponding to FIG. 3, and is a cross-sectional view illustrating a semiconductor light-emitting device 111 according to a third embodiment of the present disclosure. Hereinafter, structures corresponding to the structures described for the semiconductor light-emitting device 1 are denoted by like reference numerals and a description thereof will be omitted.

Referring to FIG. 11, the buffer layer 21 according to the semiconductor light-emitting device 111 does not have the empty holes 25. As described above, according to the semiconductor light-emitting device 111, the same effects as those described for the semiconductor light-emitting device 1 may be achieved. The buffer layer 21 according to the third embodiment may also be applied to the buffer layer 21 according to the second embodiment described above.

Figure 12:
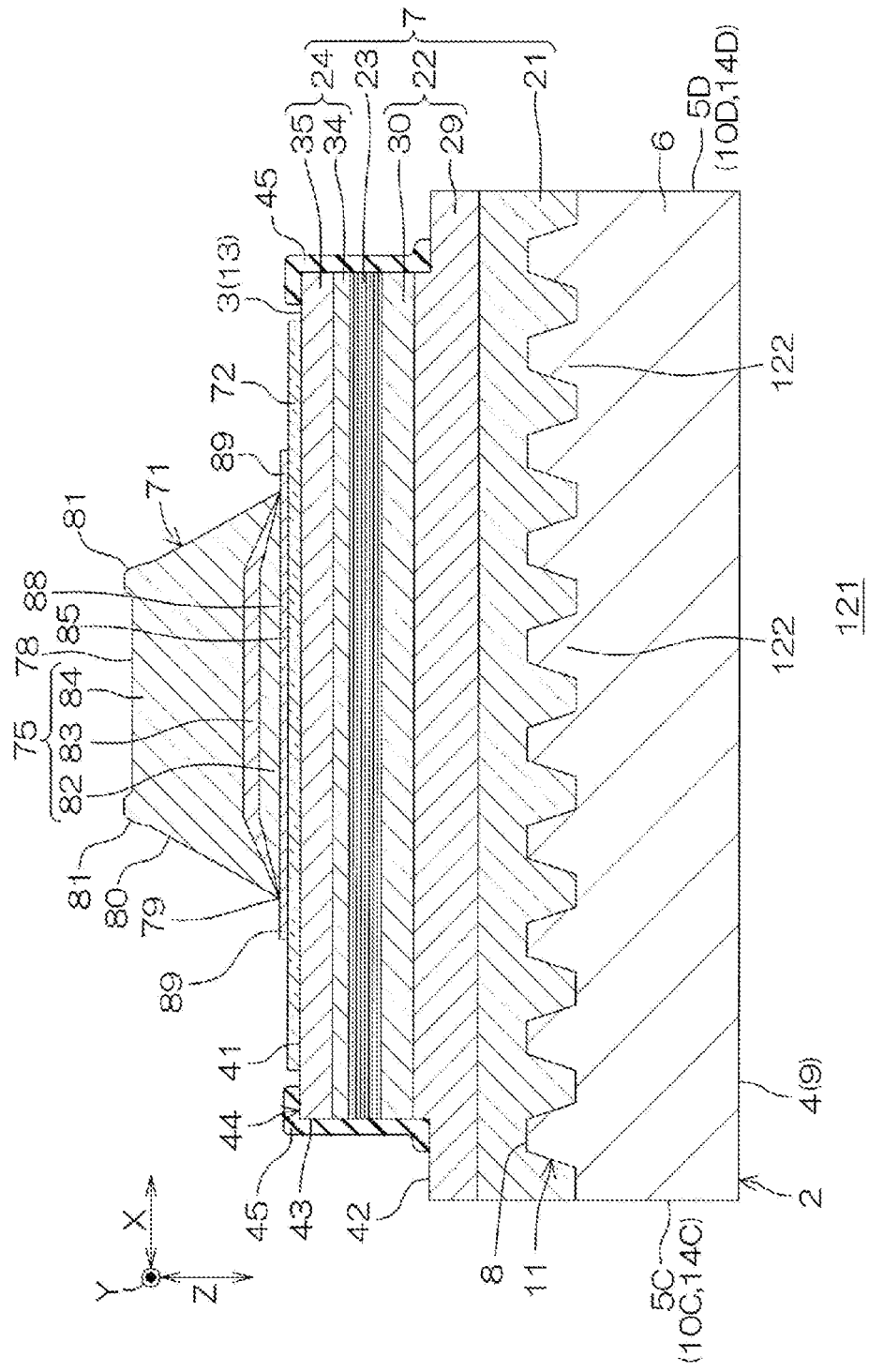
FIG. 12 is a cross-sectional view of a region corresponding to FIG. 3, and is a cross-sectional view illustrating a semiconductor light-emitting device according to a fourth embodiment of the present disclosure.

FIG. 12 is a cross-sectional view of a region corresponding to FIG. 3, and is a cross-sectional view illustrating a semiconductor light-emitting device 121 according to a fourth embodiment of the present disclosure. Hereinafter, structures corresponding to the structures described for the semiconductor light-emitting device 1 are denoted by like reference numerals and a description thereof will be omitted.

Referring to FIG. 12, in the present embodiment, the uneven structure 11 according to the semiconductor light-emitting device 121 includes a plurality of protrusions 122 formed of a part of the substrate 6, instead of the protrusions 12. The protrusions 122 are formed by selectively digging down the first substrate main surface 8 of the substrate 6 toward the second substrate main surface 9 by an etching method. The etching method may be a wet etching method and/or a dry etching method.

The protrusions 122 are formed in a frustum shape, a dome shape, or a hemispherical shape. The protrusions 122 may be formed in a truncated cone shape or an n-truncated (where n≥3) pyramid shape as an example of the frustum shape. The protrusions 122 are formed on the first substrate main surface 8 at intervals from one another. The protrusions 122 may be formed in a matrix or zig-zag form in a plan view.

As described above, according to the semiconductor light-emitting device 121, the same effects as those described for the semiconductor light-emitting device 1 may be achieved. The uneven structure 11 according to the fourth embodiment may also be applied to the uneven structure 11 according to the second embodiment and the third embodiment described above.

Figure 13:
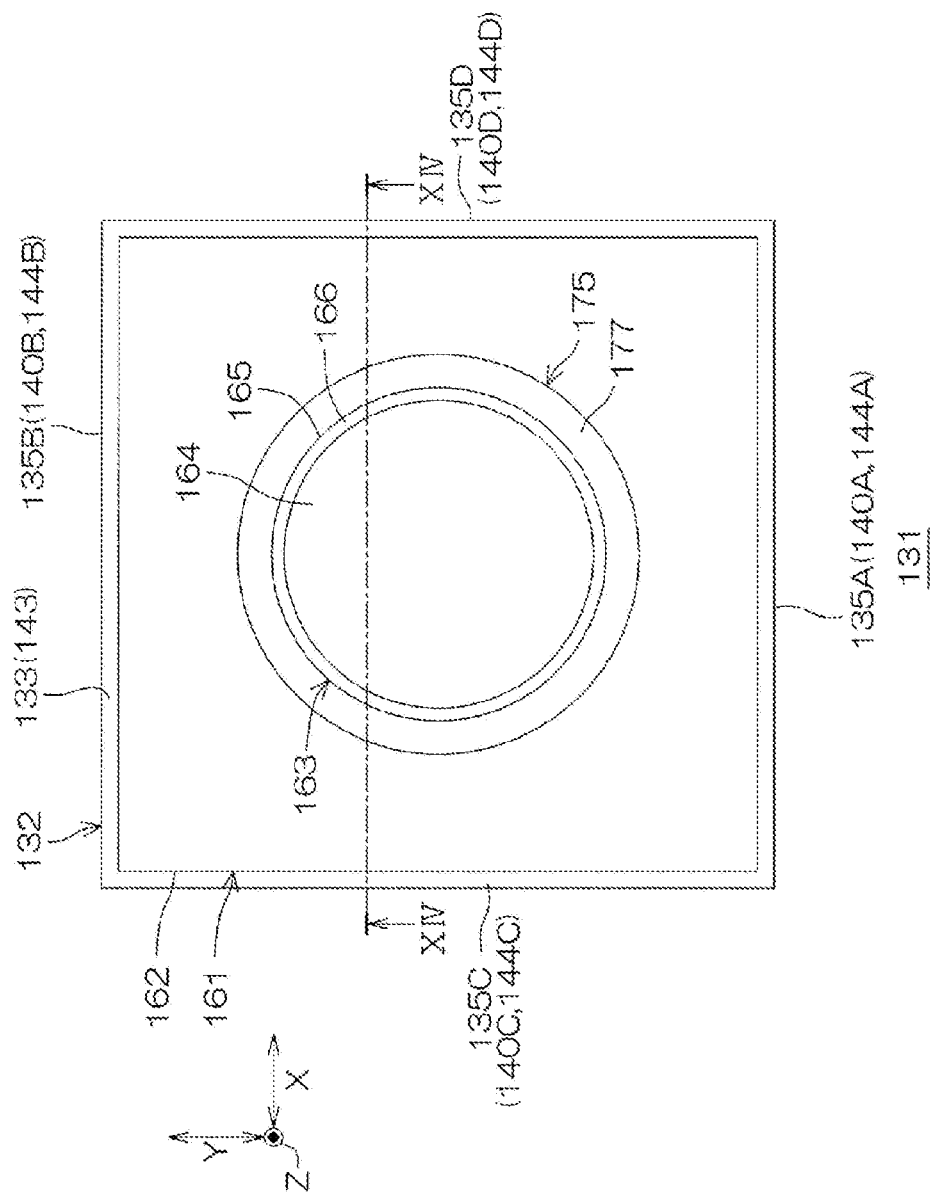
FIG. 13 is a plan view illustrating a semiconductor light-emitting device according to a fifth embodiment of the present disclosure.
Figure 14:
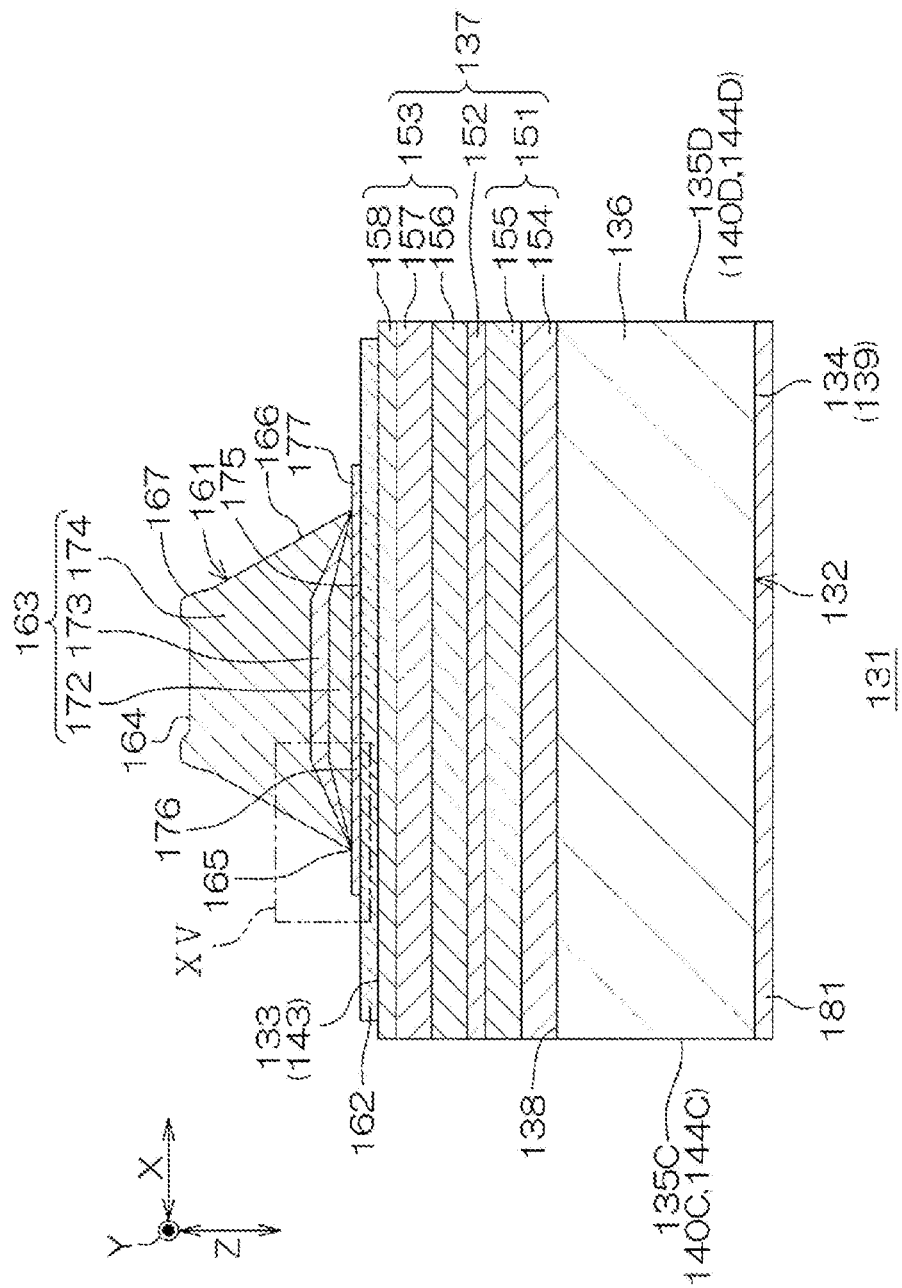
FIG. 14 is a cross-sectional view taken along line XIV-XIV in FIG. 13.
Figure 15:
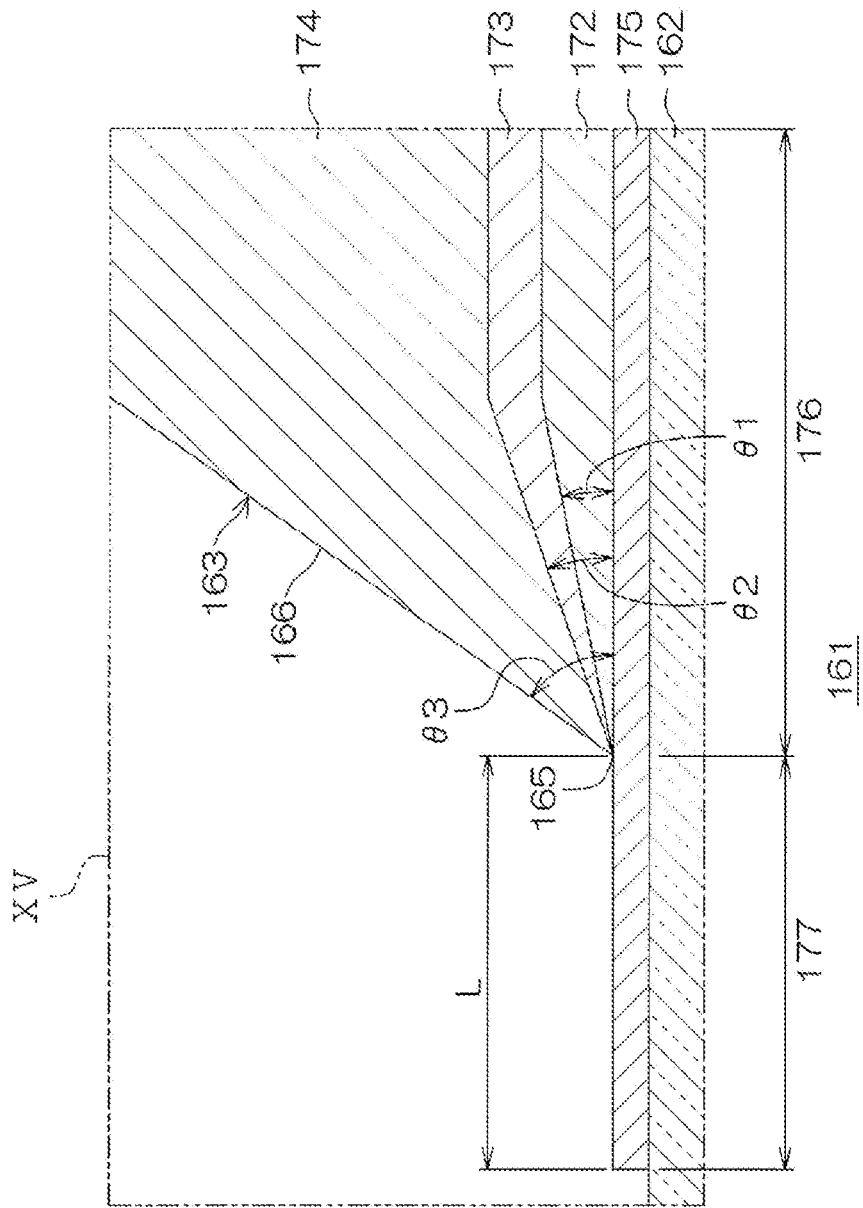
FIG. 15 is an enlarged view of a region XV shown in FIG. 14.

FIG. 13 is a plan view illustrating a semiconductor light-emitting device 131 according to a fifth embodiment of the present disclosure. FIG. 14 is a cross-sectional view taken along line XIV-XIV in FIG. 13. FIG. 15 is an enlarged view of a region XV shown in FIG. 14.

Referring to FIGS. 13 and 14, the semiconductor light-emitting device 131 includes a chip body 132. The chip body 132 includes a first chip main surface 133 on one side, a second chip main surface 134 on the other side, and chip side surfaces 135A, 135B, 135C, and 135D connecting the first chip main surface 133 and the second chip main surface 134.

More specifically, the chip side surfaces 135A to 135D include a first chip side surface 135A, a second chip side surface 135B, a third chip side surface 135C, and a fourth chip side surface 135D. The first chip main surface 133 and the second chip main surface 134 are formed in a square shape in a plan view as viewed in their normal direction Z (hereinafter, simply referred to as "plan view").

The first chip side surface 135A and the second chip side surface 135B extend in a first direction X in a plan view and face each other in a second direction Y intersecting the first direction X. The third chip side surface 135C and the fourth chip side surface 135D extend along the second direction Y in a plan view and face each other in the first direction X. More specifically, the second direction Y is orthogonal to the first direction X. The chip side surfaces 135A to 135D extend in plane along the normal direction Z.

More specifically, the chip body 132 has a stacked structure including a substrate 136 and a semiconductor light-emitting layer 137. The substrate 136 forms the second chip main surface 134 and parts of the chip side surfaces 135A to 135D of the chip body 132. The semiconductor light-emitting layer 137 forms the first chip main surface 133 and parts of the chip side surfaces 135A to 135D of the chip body 132.

In the present embodiment, the semiconductor light-emitting layer 137 generates light having a peak emission wavelength in a range of 550 nm or more and 900 nm or less. That is, the semiconductor light-emitting layer 137 generates red light. The light generated by the semiconductor light-emitting layer 137 is extracted from the first chip main surface 133 of the chip body 132.

The substrate 136 includes a first substrate main surface 138 on one side, a second substrate main surface 139 on the other side, and substrate side surfaces 140A, 140B, 140C, and 140D connecting the first substrate main surface 138 and the second substrate main surface 139.

More specifically, the substrate side surfaces 140A to 140D include a first substrate side surface 140A, a second substrate side surface 140B, a third substrate side surface 140C, and a fourth substrate side surface 140D. The first substrate main surface 138 and the second substrate main surface 139 are formed in a square shape in a plan view. The second substrate main surface 139 forms the second chip main surface 134 of the chip body 132. The substrate side surfaces 140A to 140D form parts of the chip side surfaces 135A to 135D of the chip body 132, respectively.

In the present embodiment, the substrate 136 is formed as an n-type GaAs substrate. The thickness of the substrate 136 may be 50 μm or more and 200 μm or less. The thickness of the substrate 136 may be 50 μm or more and 100 μm or less, 100 μm or more and 150 μm or less, or 150 μm or more and 200 μm or less.

The semiconductor light-emitting layer 137 is stacked on the first substrate main surface 138 of the substrate 136. The semiconductor light-emitting layer 137 includes a semiconductor main surface 143 and semiconductor side surfaces 144A, 144B, 144C and 144D. More specifically, the semiconductor side surfaces 144A to 144D include a first semiconductor side surface 144A, a second semiconductor side surface 144B, a third semiconductor side surface 144C, and a fourth semiconductor side surface 144D.

The semiconductor main surface 143 forms the first chip main surface 133 of the chip body 132. The semiconductor main surface 143 is formed in a square shape in a plan view. The semiconductor main surface 143 is a light extraction surface. The semiconductor side surfaces 144A to 144D are connected to the substrate side surfaces 140A to 140D. The semiconductor side surfaces 144A to 144D are formed flush with the substrate side surfaces 140A to 140D. The semiconductor side surfaces 144A to 144D form parts of the chip side surfaces 135A to 135D of the chip body 132, respectively.

The semiconductor light-emitting layer 137 has a stacked structure including an n-type semiconductor layer 151, an active layer 152, and a p-type semiconductor layer 153, which are stacked sequentially from a side of the first substrate main surface 138 of the substrate 136.

The n-type semiconductor layer 151 has a stacked structure including an n-type buffer layer 154 and an n-type clad layer 155. The n-type buffer layer 154 is formed on the first substrate main surface 138 of the substrate 136. In the present embodiment, the n-type buffer layer 154 includes GaAs with an n-type impurity added. The n-type clad layer 155 is stacked on the n-type buffer layer 154. In the present embodiment, the n-type clad layer 155 includes AlGaInP with an n-type impurity added.

The active layer 152 is stacked on the n-type semiconductor layer 151. In the present embodiment, the active layer 152 includes AlGaInP with no impurity added.

The p-type semiconductor layer 153 has a stacked structure including a p-type clad layer 156, a p-type current diffusion layer 157, and a p-type contact layer 158. The p-type clad layer 156 is formed on the active layer 152. The p-type clad layer 156 includes AlGaInP with a p-type impurity added.

The p-type current diffusion layer 157 is formed on the p-type clad layer 156. The p-type current diffusion layer 157 includes AlGaInP or GaP with a p-type impurity added. The p-type current diffusion layer 157 may be omitted as necessary. The p-type contact layer 158 is formed on the p-type current diffusion layer 157. The p-type contact layer 158 includes GaP with a p-type impurity added.

A p-side electrode 161 as an example of the electrode structure is formed on the semiconductor main surface 143. The p-side electrode 161 is electrically connected to the p-type semiconductor layer 153 (p-type contact layer 158).

More specifically, the p-side electrode 161 includes an ITO electrode 162 including indium tin oxide (ITO). The ITO electrode 162 is formed as a light-transmitting electrode that transmits the light generated by the semiconductor light-emitting layer 137. The ITO electrode 162 is formed on the p-type semiconductor layer 153 (p-type contact layer 158). The ITO electrode 162 is electrically connected to the p-type semiconductor layer 153 (p-type contact layer 158).

The ITO electrode 162 is formed with an interval inward from the semiconductor side surfaces 144A to 144D of the semiconductor light-emitting layer 137. The ITO electrode 162 exposes a part of the semiconductor main surface 143. The ITO electrode 162 may cover the entire region of the entire semiconductor main surface 143. The ITO electrode 162 has a first area S1 in a plan view.

The thickness of the ITO electrode 162 may be 10 nm or more and 500 nm or less. The thickness of the ITO electrode 162 may be 10 nm or more and 100 nm or less, 100 nm or more and 200 nm or less, 200 nm or more and 300 nm or less, 300 nm or more and 400 nm or less, or 400 nm or more and 500 nm or less. In the present embodiment, the thickness of the ITO electrode 162 is 50 nm or more and 150 nm or less.

The p-side electrode 161 further includes a wiring electrode 163 formed on the ITO electrode 162. The wiring electrode 163 has a second area S2 (where S2<S1) less than the first area S1 of the ITO electrode 162 in a plan view. The wiring electrode 163 is formed with an interval inward from the periphery of the ITO electrode 162. The wiring electrode 163 is formed on the ITO electrode 162 in such a manner that the area of the exposed part of the ITO electrode 162 is equal to or larger than the area of the concealed part of the ITO electrode 162 in a plan view. Thus, the entire region of the wiring electrode 163 overlaps the ITO electrode 162 in a plan view.

In the present embodiment, the wiring electrode 163 is formed in a circular shape in a plan view. The planar shape of the wiring electrode 163 is arbitrary and is not limited to a specific shape. The wiring electrode 163 may be formed in a polygonal shape or an elliptical shape in a plan view.

The wiring electrode 163 is formed in a trapezoidal shape having a top 164, a base 165, and a sidewall 166 inclined downward from the top 164 toward the base 165 in a cross-sectional view. The wiring electrode 163 has a swelling 167 protruding outward at an edge portion connecting the top 164 and the sidewall 166.

The swelling 167 protrudes toward the normal direction Z and a direction along the top 164. The swelling 167 is formed in an annular shape extending along the periphery of the top 164 in a plan view. The swelling 167 defines a region to which an electrically conductive bonding member such as a bonding wire or the like is connected in the wiring electrode 163.

In the present embodiment, the wiring electrode 163 has a stacked structure including an Al electrode 172, a Ti electrode 173, and a Au electrode 174, which are stacked sequentially from a side of the ITO electrode 162.

The Al electrode 172 includes aluminum (Al). The Al electrode 172 may be formed of pure Al or an Al alloy. The Al alloy may be an AlCu alloy, an AlSi alloy, an Al SiCu alloy, or the like. In the present embodiment, the Al electrode 172 is formed of pure Al.

The Al electrode 172 is formed as a light-reflecting electrode that reflects the light generated by the semiconductor light-emitting layer 137. The Al electrode 172 is formed in a trapezoidal shape in a cross-sectional view. The sidewall of the Al electrode 172 has a first inclination angle θ1. The first inclination angle θ1 is an angle formed inside the Al electrode 172 by the sidewall of the Al electrode 172 with respect to the semiconductor main surface 143.

The thickness of the Al electrode 172 may be 100 nm or more and 500 nm or less. The thickness of the Al electrode 172 may be 100 nm or more and 200 nm or less, 200 nm or more and 300 nm or less, 300 nm or more and 400 nm or less, or 400 nm or more and 500 nm or less. In the present embodiment, the thickness of the Al electrode 172 is 250 nm or more and 350 nm or less.

The Ti electrode 173 includes titanium (Ti). The Ti electrode 173 is formed as an adhesive layer that increases the adhesion of the Au electrode 174 to the Al electrode 172. The Ti electrode 173 covers substantially the entire region of the Al electrode 172. The Ti electrode 173 is formed in a trapezoidal shape in a sectional view. The sidewall of the Ti electrode 173 covers the sidewall of the Al electrode 172.

The sidewall of the Ti electrode 173 has a second inclination angle θ2 (where θ1<θ2) exceeding the first inclination angle θ1 of the Al electrode 172. The second inclination angle θ2 is an angle formed inside the Ti electrode 173 by the sidewall of the Ti electrode 173 with respect to the semiconductor main surface 143.

The thickness of the Ti electrode 173 may be 100 nm or more and 500 nm or less. The thickness of the Ti electrode 173 may be 100 nm or more and 200 nm or less, 200 nm or more and 300 nm or less, 300 nm or more and 400 nm or less, or 400 nm or more and 500 nm or less. In the present embodiment, the thickness of the Ti electrode 173 is 150 nm or more and 250 nm or less.

The Au electrode 174 includes gold (Au). The Au electrode 174 covers substantially the entire region of the Ti electrode 173. The Au electrode 174 is formed in a trapezoidal shape in a cross-sectional view. The Au electrode 174 forms an outer surface of the wiring electrode 163. The sidewall of the Au electrode 174 covers the sidewall of the Ti electrode 173.

The sidewall of the Au electrode 174 has a third inclination angle θ3 (where θ1<θ2<θ3) exceeding the second inclination angle θ2 of the Ti electrode 173. The third inclination angle θ3 is an angle formed inside the Au electrode 174 by the sidewall of the Au electrode 174 with respect to the semiconductor main surface 143.

The thickness of the Au electrode 174 may be 1 μm or more and 5 μm or less. The thickness of the Au electrode 174 may be 1 μm or more and 2 μm or less, 2 μm or more and 3 μm or less, 3 μm or more and 4 μm or less, or 4 μm or more and 5 μm or less. In the present embodiment, the thickness of the Au electrode 174 is 1.5 μm or more and 2.5 μm or less.

The p-side electrode 161 further includes a barrier electrode 175 interposed in a region between the ITO electrode 162 and the wiring electrode 163 (Al electrode 172). The barrier electrode 175 is formed as a protective electrode that suppresses galvanic corrosion of the ITO electrode 162 due to Al of the Al electrode 172.

The barrier electrode 175 includes at least one of a TiN layer and a Cr layer. The barrier electrode 175 may have a single layer structure consisting of a TiN layer or a Cr layer. The Cr layer has a light transmissivity smaller than the TiN layer. Therefore, the barrier electrode 175 may be formed of a TiN layer having a relatively large light transmissivity.

The thickness of the barrier electrode 175 is less than the thickness of the ITO electrode 162. The thickness of the barrier electrode 175 is less than the thickness of the Al electrode 172. The thickness of the barrier electrode 175 may be 1 nm or more and 5 nm or less. The thickness of the barrier electrode 175 may be 1 nm or more and 2 nm or less, 2 nm or more and 3 nm or less, 3 nm or more and 4 nm or less, or 4 nm or more and 5 nm or less. In the present embodiment, the thickness of the barrier electrode 175 is 1.5 nm or more and 2.5 nm or less.

The barrier electrode 175 has a third area S3 (where S2<S3) exceeding the second area S2 of the wiring electrode 163 (Al electrode 172) in a plan view. More specifically, the barrier electrode 175 includes a first region 176 and a second region 177. The first region 176 is interposed in a region between the ITO electrode 162 and the wiring electrode 163. The second region 177 is drawn out from the first region 176 to a region outside the wiring electrode 163 in a plan view.

The first region 176 is interposed in the entire region between the ITO electrode 162 and the wiring electrode 163. The second region 177 is formed in a band shape extending along the periphery of the wiring electrode 163 in a plan view. More specifically, the second region 177 is formed in an annular shape extending along the periphery of the wiring electrode 163 in a plan view.

In the present embodiment, the periphery of the second region 177 is located in a region between the periphery of the ITO electrode 162 and the periphery of the wiring electrode 163 with an interval from the periphery of the ITO electrode 162. Thus, the second region 177 exposes a part of the ITO electrode 162.

The second region 177 has a lead-out length L exceeding the thickness of the barrier electrode 175. The lead-out length L may be 100 times or more of the thickness of the barrier electrode 175. The lead-out length L may exceed the thickness of the ITO electrode 162. The lead-out length L may exceed the thickness of the Al electrode 172. More specifically, the lead-out length L may be twice or more of the thickness of the Al electrode 172.

The lead-out length L may be 0.1 μm or more and 5 μm or less. The lead-out length L may be 0.1 μm or more and 1 μm or less, 1 μm or more and 2 μm or less, 2 μm or more and 3 μm or less, 3 μm or more and 4 μm or less, or 4 μm or more and 5 μm or less. In the present embodiment, the lead-out length L is 1 μm or more and 3 μm or less.

Referring to FIG. 14, an n-side electrode 181 is formed on the second substrate main surface 139 of the substrate 136. The n-side electrode 181 is electrically connected to the substrate 136.

The n-side electrode 181 may include at least one of a Ge layer, a Ti layer, a Ni layer, a Au layer, a Ag layer, and an Al layer. The n-side electrode 181 may have a single layer structure including a Ge layer, a Ti layer, a Ni layer, a Au layer, a Ag layer, or an Al layer. The n-side electrode 181 may have a stacked structure in which at least two of a Ge layer, a Ti layer, a Ni layer, a Au layer, a Ag layer, or an Al layer are stacked in an arbitrary manner.

When a forward voltage VF is applied between the p-side electrode 161 and the n-side electrode 181, electrons are supplied from the n-type semiconductor layer 151 to the active layer 152, and holes are supplied from the p-type semiconductor layer 153 to the active layer 152. The electrons and holes supplied to the active layer 152 are combined in the active layer 152 to thereby generate light.

As described above, the semiconductor light-emitting device 131 includes the p-side electrode 161 formed on the semiconductor main surface 143 of the semiconductor light-emitting layer 137. The p-side electrode 161 includes the barrier electrode 175 interposed in a region between the ITO electrode 162 and the Al electrode 172. Thus, it is possible to suppress the galvanic corrosion of the ITO electrode 162 due to Al of the Al electrode 172 by the barrier electrode 175.

As a result, the light generated by the semiconductor light-emitting layer 137 may be appropriately incident on the Al electrode 172 via the ITO electrode 162, and the light reflected by the Al electrode 172 may be appropriately incident on the semiconductor light-emitting layer 137 via the ITO electrode 162. Thus, it is possible to provide the semiconductor light-emitting device 131 capable of enhancing the light extraction efficiency.

Furthermore, the barrier electrode 175 includes the first region 176 interposed in a region between the ITO electrode 162 and the Al electrode 172, and the second region 177 drawn out from the first region 176 to a region outside the Al electrode 172 in a plan view.

The galvanic corrosion tends to occur in the ITO electrode 162 starting from the periphery of the Al electrode 172. Therefore, it is possible to appropriately suppress the galvanic corrosion of the ITO electrode 162 starting from the periphery of the Al electrode 172 by drawing out the barrier electrode 175 to a region outside the Al electrode 172. Furthermore, it is possible to enhance the effects of suppressing the galvanic corrosion by forming the second region 177 so as to surround the periphery of the Al electrode 172.

In addition, the Al electrode 172 is formed in a trapezoidal shape in a cross-sectional view. Thus, it is possible to reduce a volume of a portion in the Al electrode 172 that forms the periphery of the Al electrode 172. As a result, it is possible to appropriately suppress the galvanic corrosion of the ITO electrode 162 starting from the periphery of the Al electrode 172 using the structure of the Al electrode 172.

Figure 16:
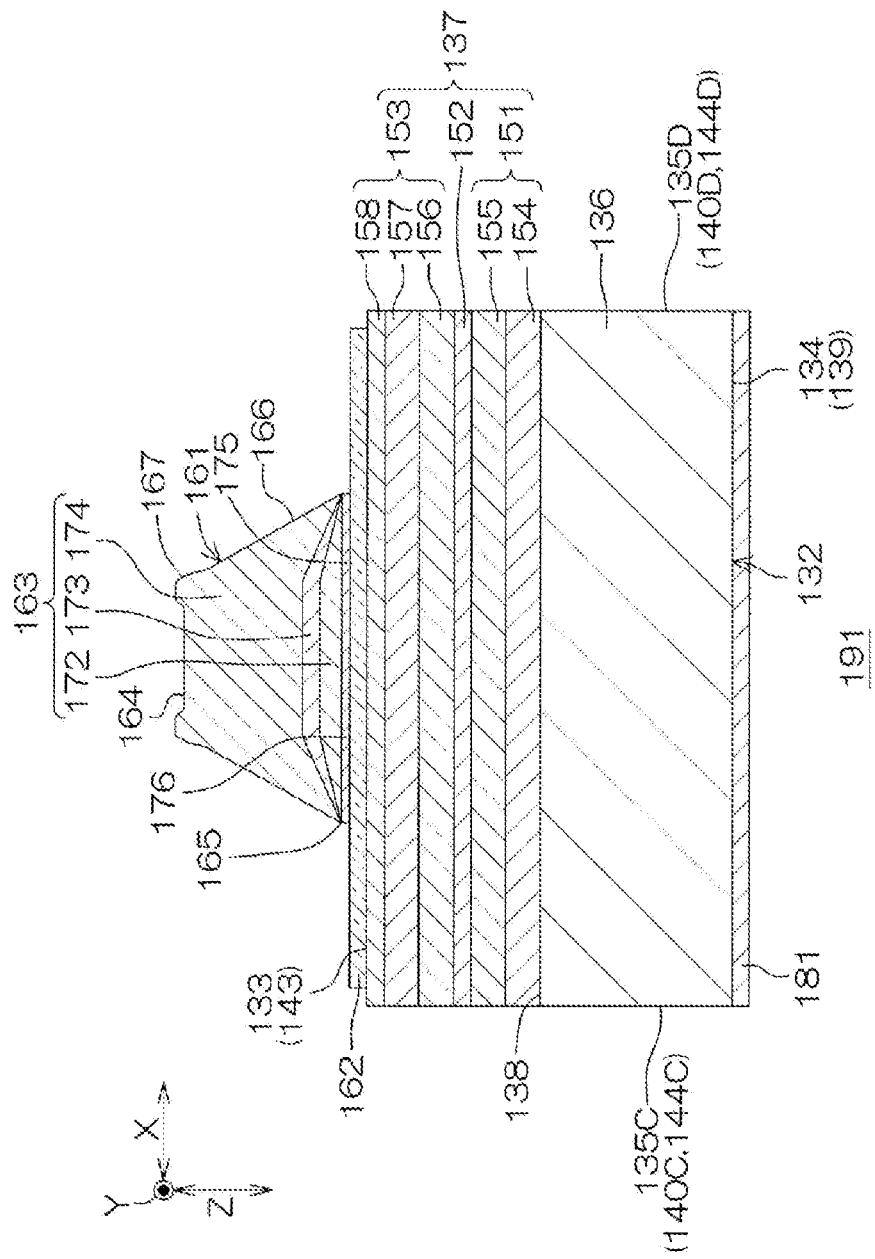
FIG. 16 is a cross-sectional view of a region corresponding to FIG. 14, and is a plan view illustrating a semiconductor light-emitting device according to a sixth embodiment of the present disclosure.

FIG. 16 is a cross-sectional view of a region corresponding to FIG. 14, and is a plan view illustrating a semiconductor light-emitting device 191 according to a sixth embodiment of the present disclosure. Hereinafter, structures corresponding to the structures described for the semiconductor light-emitting device 131 are denoted by like reference numerals and a description thereof will be omitted.

The barrier electrode 175 of the p-side electrode 161 according to the semiconductor light-emitting device 191 does not have the second region 177. The barrier electrode 175 is interposed only in the region between the ITO electrode 162 and the wiring electrode 163. The periphery of the barrier electrode 175 may be located inside the wiring electrode 163 with respect to the periphery of the wiring electrode 163 in a plan view. The periphery of the barrier electrode 175 may be formed flush with the periphery of the wiring electrode 163.

As described above, according to the semiconductor light-emitting device 191, the same effects as those described for the semiconductor light-emitting device 131 may be achieved except the effects by the second region 177 of the barrier electrode 175.

Although the embodiments of the present disclosure have been described above, the present disclosure may be implemented in other forms.

In the first to fourth embodiments described above, there have been described examples in which the wiring electrode 55 related to the n-side electrode 51 includes the body 56 and the wiring 57. However, the wiring electrode 55 that does not have the wiring 57 may be employed. In this case, the wiring 54 of the ITO electrode 52 and the wiring 67 of the barrier electrode 65 may be excluded.

In the first to fourth embodiments described above, there have been described examples in which the wiring electrode 75 related to the p-side electrode 71 includes the body 76 and the wiring 77. However, the wiring electrode 75 that does not have the wiring 77 may be employed. In this case, the wiring 87 of the barrier electrode 85 may be excluded.

In the first to fourth embodiments described above, there have been described examples in which the wiring electrode 55 related to the n-side electrode 51 has a stacked structure including the Al electrode 62, the Ti electrode 63, and the Au electrode 64. However, the wiring electrode 55 may have a single layer structure consisting of the Al electrode 62.

In the first to fourth embodiments described above, the structure on the Al electrode 62 is arbitrary, and the Ti electrode 63 and the Au electrode 64 are not necessarily stacked. For example, a platinum (Pt) layer or a tungsten (W) layer may be formed on the Al electrode 62 instead of the Ti electrode 63 and the Au electrode 64.

In the first to fourth embodiments described above, there have been described examples in which the wiring electrode 75 related to the p-side electrode 71 has a stacked structure including the Al electrode 82, the Ti electrode 83, and the Au electrode 84. However, the wiring electrode 75 may have a single layer structure consisting of the Al electrode 82.

Furthermore, in the first to fourth embodiments described above, the structure on the Al electrode 82 is arbitrary, and the Ti electrode 83 and the Au electrode 84 are not necessarily stacked. For example, a platinum (Pt) layer or a tungsten (W) layer may be formed on the Al electrode 82 instead of the Ti electrode 83 and the Au electrode 84.

In the first to fourth embodiments described above, there have been described examples in which the uneven structure 11 is formed on the first substrate main surface 8 of the substrate 6. However, in the first to fourth embodiments, no uneven structure 11 may be formed on the first substrate main surface 8 of the substrate 6.

In the fifth and sixth embodiments described above, there have been described examples in which the wiring electrode 163 related to the p-side electrode 161 has a stacked structure including the Al electrode 172, the Ti electrode 173, and the Au electrode 174. However, the wiring electrode 163 may have a single layer structure consisting of the Al electrode 172.

In the fifth and sixth embodiments described above, the structure on the Al electrode 172 is arbitrary, and the Ti electrode 173 and the Au electrode 174 are not necessarily stacked. For example, a platinum (Pt) layer or a tungsten (W) layer may be formed on the Al electrode 172 instead of the Ti electrode 173 and the Au electrode 174.

In the embodiments described above, there has been described examples in which the electrodes 51, 71, and 161 including the ITO electrodes 52, 72, and 162, the Al electrodes 62, 82, and 172, and the barrier electrodes 65, 85 and 175 interposed in the regions between the ITO electrodes 52, 72, and 162 and the Al electrodes 62, 82, and 172 are incorporated in the semiconductor light-emitting device 1, 101, 111, 121, 131, or 191 as examples of the electrode structure.

However, the electrode structure including the ITO electrodes, the Al electrodes, and the barrier electrodes interposed in the regions between the ITO electrodes and the Al electrodes may be incorporated in thin film materials or the like of wiring films, electrode films, reflective electrode films, storage capacitor electrodes, and common electrodes in the field of semiconductor devices such as a metal insulator semiconductor field effect transistor (MISFET), an insulated gate bipolar transistor (IGBT), a diode or the like, in addition to the semiconductor light-emitting device, or in the field of thin display devices such as a liquid crystal display device, a plasma display device, an electroluminescence display device, a field emission display device or the like. Even in those cases, the barrier electrode including the first region interposed in the region between the ITO and Al electrodes and the second region drawn out from the first region to the region outside the Al electrode in a plan view may be formed.

In each of the embodiments described above, a structure in which the electrical conductivity type of each semiconductor component is inverted may be employed. That is, the p-type component may be formed in an n-type and the n-type component may be formed in a p-type.

The present disclosure does not limit any combination of the features described in the first to sixth embodiments. The first to sixth embodiments may be combined in an arbitrary manner and in an arbitrary form among them. That is, a form in which the features described in the first to sixth embodiments are combined in an arbitrary manner and in an arbitrary form may be employed.

Other various design changes may be made within the scope of the matters described in the accompanying claims. Hereinafter, examples of the features extracted from the present disclosure and the drawings will be described below.

[A1] A semiconductor light-emitting device including: a semiconductor light-emitting layer having a main surface and generates red light; a light-transmitting electrode including ITO and covering the main surface of the semiconductor light-emitting layer; a light reflecting electrode including Al and covering the light-transmitting electrode; and a barrier electrode including at least one of TiN and Cr and interposed in a region between the light-transmitting electrode and the light reflecting electrode.

With this structure, it is possible to suppress galvanic corrosion of the light-transmitting electrode by the barrier electrode. Accordingly, the light generated by the semiconductor light-emitting layer may be appropriately incident on the light-reflecting electrode via the light-transmitting electrode, and the light reflected by the light-reflecting electrode may be appropriately incident on the semiconductor light-emitting layer via the light-transmitting electrode. Thus, it is possible to provide the semiconductor light-emitting device capable of enhancing light extraction efficiency.

[A2] The device of A1, wherein a periphery of the barrier electrode is located inside the light-reflecting electrode with respect to a periphery of the light-reflecting electrode in a plan view.

[A3] The device of A1, wherein a periphery of the barrier electrode is formed flush with a periphery of the light-reflecting electrode in a plan view.

[A4] The device of A1, wherein the barrier electrode includes a first region interposed in a region between the light-transmitting electrode and the light-reflecting electrode, and a second region drawn out from the first region to a region outside the light-reflecting electrode in a plan view.

[A5] The device of A4, wherein the second region of the barrier electrode surrounds a periphery of the light-reflecting electrode in a plan view.

[A6] The device of A4 or A5, wherein the second region of the barrier electrode has a lead-out length exceeding a thickness of the barrier electrode.

[A7] The device of any one of A4 to A6, wherein the second region of the barrier electrode has a lead-out length exceeding a thickness of the light-reflecting electrode.

[A8] The device of any one of A1 to A7, wherein the light-reflecting electrode is formed in a trapezoidal shape in a cross-sectional view.

[A9] The device of any one of A1 to A8, wherein the barrier electrode is formed of TiN or Cr.

[A10] The device of any one of A1 to A9, wherein the barrier electrode is formed of TiN.

According to the present disclosure in some embodiments, it is possible to provide an electrode structure capable of suppressing galvanic corrosion of the ITO electrode by the barrier electrode.

According to the present disclosure in some embodiments, it is possible to provide a semiconductor light-emitting device capable of suppressing galvanic corrosion of the ITO electrode by the barrier electrode.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An electrode structure comprising:
   an indium tin oxide (ITO) electrode including ITO;
   an Al electrode including Al and covering the ITO electrode; and
   a barrier electrode including at least one of TiN and Cr and interposed in a region between the ITO electrode and the Al electrode,
   wherein the barrier electrode includes a first region and a second region drawn out from the first region to surround a periphery of the Al electrode in a plan view,
   wherein the first region has a first surface in contact with the Al electrode, and
   wherein the second region has a second surface that extends to be flush with the first surface.

2. The electrode structure of claim 1, wherein the first region is interposed in a region between the ITO electrode and the Al electrode, and
   wherein the second region is drawn out from the first region to a region outside the Al electrode in the plan view.

3. The electrode structure of claim 1, wherein the second region of the barrier electrode has a lead-out length exceeding a thickness of the barrier electrode.

4. The electrode structure of claim 1, wherein the second region of the barrier electrode has a lead-out length exceeding a thickness of the Al electrode.

5. The electrode structure of claim 1, wherein the Al electrode is formed in a trapezoidal shape in a cross-sectional view.

6. The electrode structure of claim 1, wherein the barrier electrode is formed of TiN or Cr.

7. The electrode structure of claim 1, wherein the barrier electrode is formed of TiN.

8. The electrode structure of claim 1, wherein a sidewall of the Al electrode includes a first inclined surface, and
   wherein a first metal layer is formed on the Al electrode to cover the first inclined surface.

9. The electrode structure of claim 1, wherein the barrier electrode has a light transmissivity to transmit light.

10. A semiconductor light-emitting device comprising:
    a semiconductor light-emitting layer having a main surface; and
    the electrode structure of claim 1,
    wherein the ITO electrode covers the main surface of the semiconductor light-emitting layer.

11. The device of claim 10, wherein the semiconductor light-emitting layer generates light having a peak emission wavelength in a range of 450 nm or more and 550 nm or less.

* * * * *